US011239224B2

(12) United States Patent
Fukushima et al.

(10) Patent No.: US 11,239,224 B2
(45) Date of Patent: Feb. 1, 2022

(54) POWER CONVERSION DEVICE INCLUDING A PLURALITY OF SEMICONDUCTOR MODULES

(71) Applicant: DENSO CORPORATION, Kariya (JP)

(72) Inventors: Kazuma Fukushima, Kariya (JP); Yuu Yamahira, Kariya (JP); Ryota Tanabe, Kariya (JP); Tetsuya Matsuoka, Kariya (JP); Kosuke Kamiya, Kariya (JP); Taijiro Momose, Kariya (JP)

(73) Assignee: DENSO CORPORATION, Kariya (JP)

(*) Notice: Subject to any disclaimer, the term of this patent is extended or adjusted under 35 U.S.C. 154(b) by 172 days.

(21) Appl. No.: 16/785,913

(22) Filed: Feb. 10, 2020

(65) Prior Publication Data

US 2020/0176435 A1    Jun. 4, 2020

Related U.S. Application Data

(63) Continuation of application No. PCT/JP2018/029774, filed on Aug. 8, 2018.

(30) Foreign Application Priority Data

Aug. 11, 2017    (JP) .............................. JP2017-156256

(51) Int. Cl.
*H05K 1/14*    (2006.01)
*H01L 25/18*    (2006.01)
(Continued)

(52) U.S. Cl.
CPC .............. *H01L 25/18* (2013.01); *H01L 23/50* (2013.01); *H02M 7/003* (2013.01); *H02M 3/158* (2013.01); *H02M 7/5387* (2013.01); *H02P 27/06* (2013.01)

(58) Field of Classification Search
CPC ........ H01L 25/18; H01L 23/50; H02M 7/003; H02M 3/158; H02M 7/5387; H02P 27/06
(Continued)

(56) References Cited

U.S. PATENT DOCUMENTS

2008/0251909 A1* 10/2008 Tokuyama ............ H01L 23/473
257/706
2009/0231811 A1* 9/2009 Tokuyama .............. H02P 27/06
361/699

FOREIGN PATENT DOCUMENTS

JP    H02-307357 A    12/1990
JP    2009-148077 A    7/2009
JP    2015-139299 A    7/2015

OTHER PUBLICATIONS

Sep. 4, 2018 International Search Report issued in International Patent Application No. PCT/JP2018/029774.

* cited by examiner

*Primary Examiner* — Andargie M Aychillhum
(74) *Attorney, Agent, or Firm* — Oliff PLC

(57) ABSTRACT

A power conversion device provided with a switching circuit unit including a plurality of upper-arm switching elements connected to positive electrode wiring and a plurality of lower-arm switching elements connected to negative electrode wiring. The power conversion device includes a first semiconductor module incorporating a plurality of the upper-arm switching elements connected together in parallel, a second semiconductor module incorporating a plurality of the lower-arm switching elements connected together in parallel, and a third semiconductor module incorporating the upper-arm switching elements connected together in series and the lower-arm switching elements connected together in series.

12 Claims, 31 Drawing Sheets

(51) Int. Cl.
 _H01L 23/50_ (2006.01)
 _H02M 7/00_ (2006.01)
 _H02M 3/158_ (2006.01)
 _H02M 7/5387_ (2007.01)
 _H02P 27/06_ (2006.01)
(58) Field of Classification Search
 USPC .......................................................... 361/736
 See application file for complete search history.

POWER CONVERSION DEVICE INCLUDING A PLURALITY OF SEMICONDUCTOR MODULES

This application is the U.S. bypass application of International Application No. PCT/JP2018/029774 filed Aug. 8, 2018 which designated the U.S. and claims priority to Japanese Patent Application No. 2017-156256, filed Aug. 11, 2017, the contents of which are incorporated herein by reference.

BACKGROUND

Technical Field

The present disclosure relates to a power conversion device including a plurality of semiconductor modules.

Description of the Related Art

Conventionally, a power conversion device including a plurality of semiconductor modules is known.

For example, the power conversion device includes a positive electrode bus bar and a negative electrode bus bar that connect the semiconductor modules to a capacitor. The positive electrode bus bar and the negative electrode bus bar partly overlap each other. This is intended to reduce inductance of the bus bars.

SUMMARY

The present disclosure is a power conversion device provided with a switching circuit unit including a plurality of upper-arm switching elements connected to positive electrode wiring and a plurality of lower-arm switching elements connected to negative electrode wiring, the power conversion device including: a first semiconductor module incorporating a plurality of the upper-arm switching elements connected together in parallel, a second semiconductor module incorporating a plurality of the lower-arm switching elements connected together in parallel, and a third semiconductor module incorporating the upper-arm switching elements connected together in series and the lower-arm switching elements connected together in series.

BRIEF DESCRIPTION OF THE DRAWINGS

The above-described objects and other objects and features and advantages of the present disclosure will be apparent from the following description taken with reference to the attached drawings.

In the accompanying drawings.

DESCRIPTION OF THE PREFERRED EMBODIMENTS

According to the above-mentioned conventional power conversion device, for example, JP-2015-139299-A discloses a power conversion device including a plurality of semiconductor modules. Specifically, the power conversion device includes a positive electrode bus bar and a negative electrode bus bar that connect the semiconductor modules to a capacitor. The positive electrode bus bar and the negative electrode bus bar partly overlap each other. This is intended to reduce inductance of the bus bars. Additionally, each semiconductor module includes series-connected upper-arm switching elements and series-connected lower-arm switching elements.

In the power conversion device disclosed in the above-mentioned patent literature, one semiconductor module constitutes a leg of each of phases in a switching circuit. As described above, each semiconductor module includes one upper-arm switching element and one lower-arm switching element. In other words, each phase includes one upper-arm switching element and one lower-arm switching element. Thus, enabling an increase in power output and current of the power conversion device is difficult.

To enable an increase in power output of and current of the power conversion device, the upper arm and lower arm in each phase may each be configured using a plurality of parallel-connected switching elements. In this case, semiconductor modules each including the above-described series-connected upper-arm switching elements and the above-described series-connected lower-arm switching elements may be connected together in parallel for use.

However, in this case, inductance component is likely to be produced in connection wiring among the plurality of semiconductor modules. Due to characteristic tolerances of the plurality of switching elements connected together in parallel, currents flowing through the switching elements may vary. Then, the variation in current and the inductance in the connection wiring may excessively increase or reduce a gate-emitter voltage in each switching element. Prevention of the excessive increase or reduction in gate-emitter voltage requires reducing a switching speed. A reduced switching speed increases a loss in each switching element. This results in an increased size and cost of the switching element.

Additionally, one power conversion device may include both an arm through which a relatively large current flows and an arm through which relatively small current flows. Such a power conversion device also has a challenge to enable a reduction in the size of the device and cost while ensuring a sufficient tolerable current for each arm.

Hereinafter, with reference to the drawings, embodiments of the present disclosure will be described.

First Embodiment

Embodiments related to a power conversion device will be described with reference to FIGS. 1 to 13.

Figure 1:
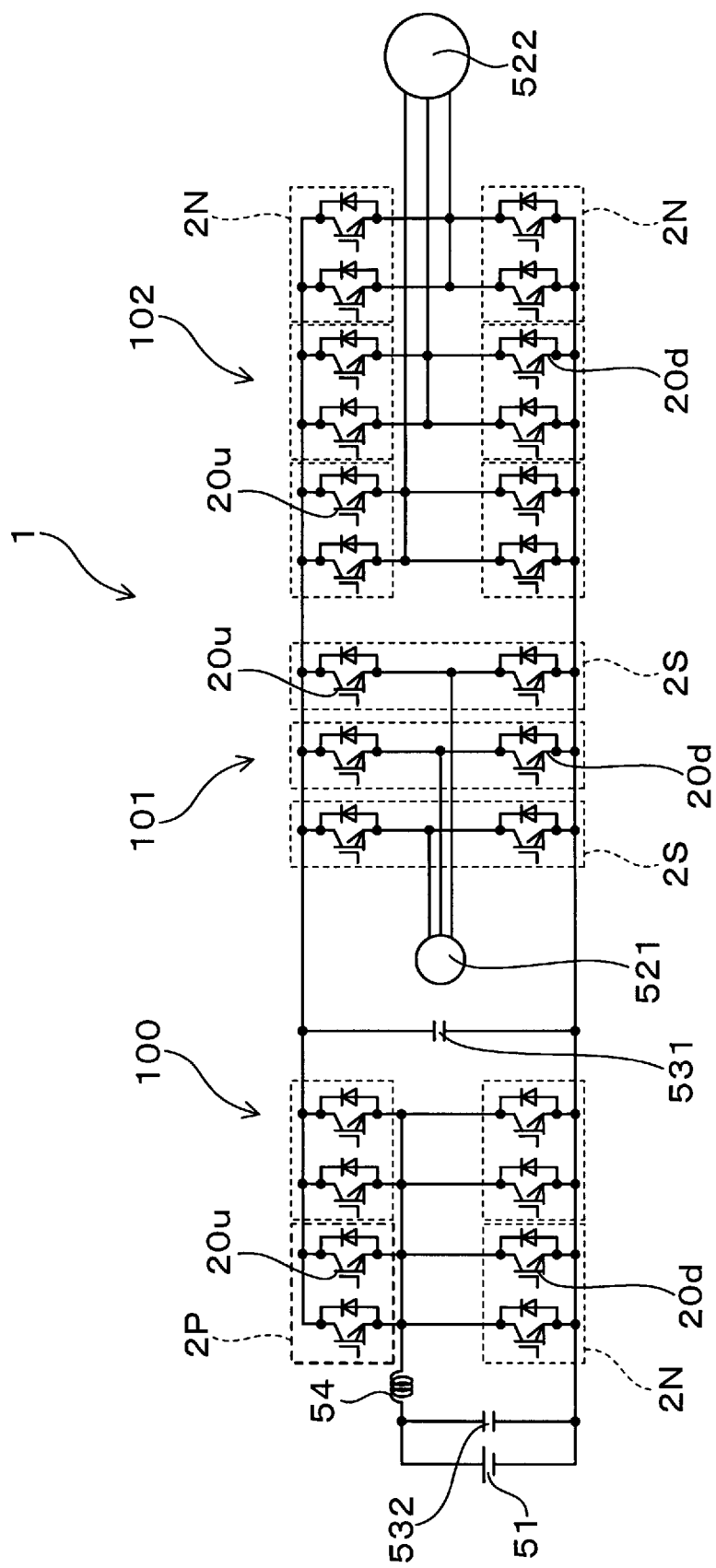
FIG. 1 is a circuit diagram of a power conversion device according to first embodiment.

As illustrated in FIG. 1, a power conversion device 1 of the present embodiment includes a switching circuit unit including a plurality of upper-arm switching elements 20u connected to positive electrode wiring and a plurality of lower-arm switching elements 20d connected to negative electrode wiring.

The power conversion device 1 includes a first semiconductor module 2P, a second semiconductor module 2N, and a third semiconductor module 2S. The first semiconductor module 2P is a semiconductor module incorporating a plurality of parallel-connected upper-arm switching elements 20u. The second semiconductor module 2N is a semiconductor module incorporating a plurality of parallel-connected lower-arm switching elements 20d. The third semiconductor module 2S is a semiconductor module incorporating an upper-arm switching element 20u and a lower-arm switching elements 20d which are mutually connected in series.

That is, the power conversion device 1 includes three types of semiconductor modules. Additionally, the power conversion device 1 includes a plurality of first semiconductor modules 2P, a plurality of semiconductor modules 2N, and a plurality of semiconductor modules 2S. Note that, as described below, the first semiconductor module 2P and the second semiconductor module 2N can have the same structure.

As illustrated in FIG. 1, the power conversion device 1 of the present embodiment includes, as a switching circuit unit, a booster circuit unit 100, a first inverter circuit unit 101, and a second inverter circuit unit 102. Power conversion between DC power and AC power is performed between a DC power supply 51 and two three-phase AC rotating electrical machines 521 and 522.

The first inverter circuit unit 101 is connected to the first rotating electrical machine 521, and the second inverter circuit unit 102 is connected to the second rotating electrical machine 522. The second rotating electrical machine 522 has a larger power output than the first rotating electrical machine 521. Accordingly, a current flowing through the circuit is larger in the second inverter circuit unit 102 driving the second rotating electrical machine 522 than in the first inverter circuit unit 101.

The first inverter circuit unit 101 includes three phase legs. That is, the three phase legs are connected together in parallel between the positive electrode wiring connected to a positive electrode of the DC power supply 51 and the negative electrode wiring connected to a negative electrode of the DC power supply 51. Each leg includes the series-connected upper-arm switching element 20u and the series-connected lower-arm switching elements 20d.

Connection points between the upper-arm switching elements 20u and the lower-arm switching elements 20d in each leg are respectively connected to three electrodes of the rotating electrical machine 521 via output wiring. Additionally, a smoothing capacitor 531 is connected between the booster circuit unit 100 and the first inverter circuit unit 101 so as to suspend the positive electrode wiring and the negative electrode wiring. Additionally, a flywheel diode is inversely connected in parallel with each switching element.

Note that each of the switching elements 20u and 20d can be configured using an IGBT. IGBT is an abbreviation for an Insulated Gate Bipolar Transistor. Additionally, the switching element can be a MOSFET. MOSFET is an abbreviation for a Metal Oxide Semiconductor Field Effect Transistor.

The first inverter circuit unit 101 includes a plurality of third semiconductor modules 2S. In other words, the three phase legs in the first inverter circuit unit 101 each include one third semiconductor modules 2S.

The second inverter circuit unit 102 also includes three phase legs. However, the upper arm and lower arm in each leg each include a plurality of parallel-connected switching elements. In the present embodiment, each arm includes a parallel connected body of two switching elements. That is, in each phase leg, the upper arm includes a parallel connected body of two upper-arm switching elements 20u, and the lower arm includes a parallel connected body of two upper-arm switching elements 20d, The parallel connected bodies are connected together in series. Additionally, the parallel connected bodies of the upper arm are integrated together in the first semiconductor module 2P, and the parallel connected bodies of the lower arm are integrated together in the second semiconductor module 2N.

The second inverter circuit unit 102 includes a plurality of the first semiconductor modules 2P and a plurality of the semiconductor modules 2N. In other words, the three phase legs in the second inverter circuit unit 102 includes one semiconductor module 2P and one semiconductor module 2N connected together in series.

The booster circuit unit 100 includes a filter capacitor 532, a reactor 54, a plurality of the upper-arm switching elements 20u, and a plurality of the lower-arm switching elements 20d. The filter capacitor 532 is connected in parallel with the DC power supply 51. One terminal of the reactor 54 is connected to a positive electrode of the DC power supply 51. The other terminal of the reactor 54 is connected to the connection points between the upper-arm switching elements 20u and the lower-arm switching elements 20d. Additionally, in the present embodiment, the booster circuit unit 100 includes a plurality of the parallel-connected upper-arm switching elements 20u and a plurality of the parallel-connected lower-arm switching elements 20d.

The booster circuit unit 100 includes a plurality of the first semiconductor modules 2P and a plurality of the second semiconductor modules 2N. The upper arm in the booster circuit unit 100 includes two first semiconductor modules 2P, and the lower arm includes two second semiconductor modules 2N.

Figure 2:
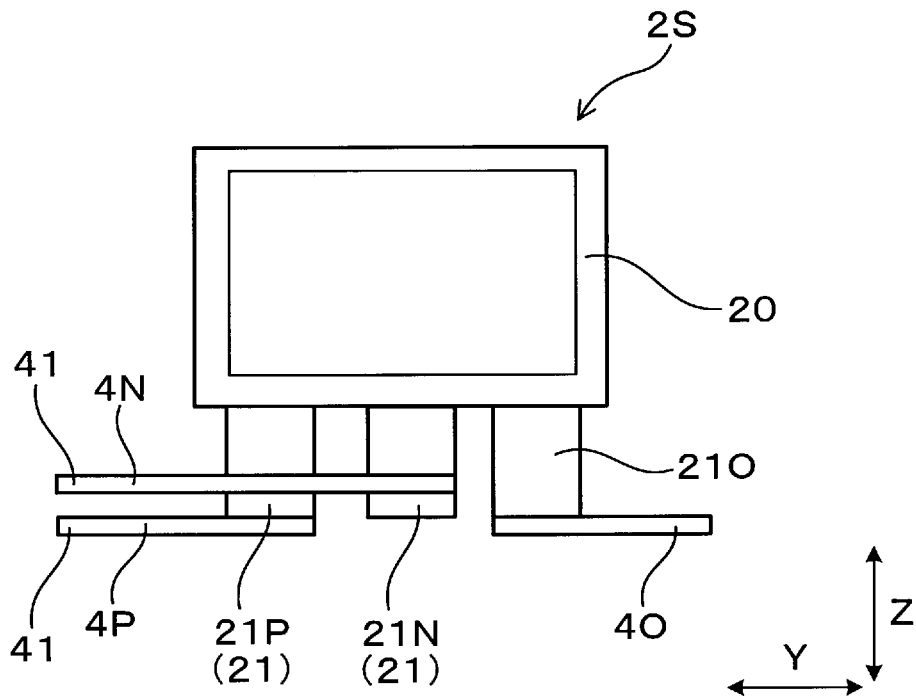
FIG. 2 is a front view of a third semiconductor module and bus bars connected to the third semiconductor module according to first embodiment.
Figure 3:
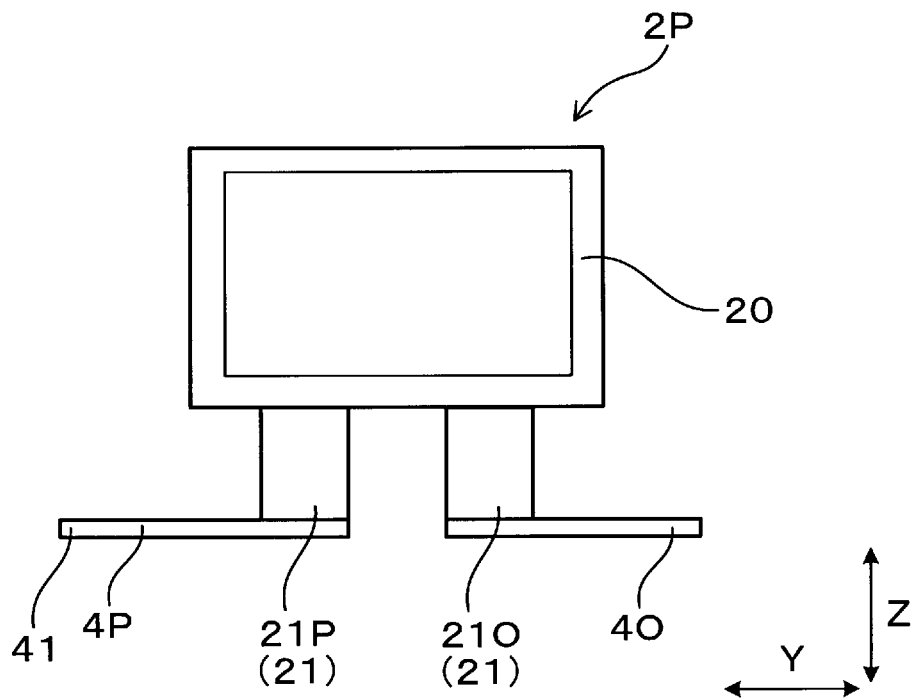
FIG. 3 is a front view of a first semiconductor module and bus bars connected to the first semiconductor module according to first embodiment.
Figure 4:
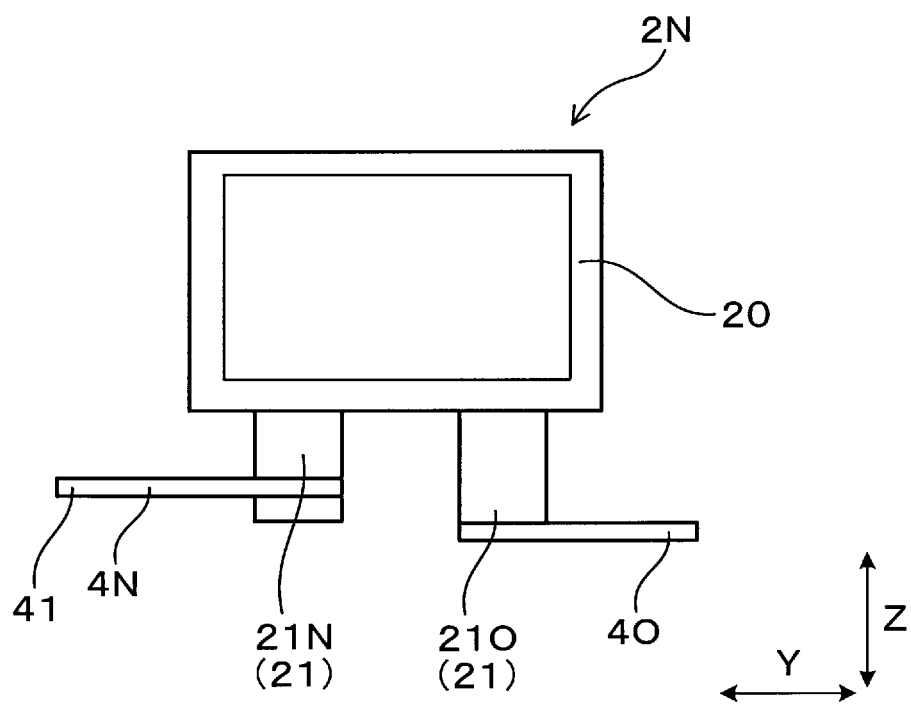
FIG. 4 is a front view of a second semiconductor module and bus bars connected to the second semiconductor module according to first embodiment.

As illustrated in FIGS. 2 to 4, the power conversion device 1 includes a positive electrode bus bar 4P constituting positive electrode wiring and a negative electrode bus bar 4N constituting negative electrode wiring.

Figure 5:
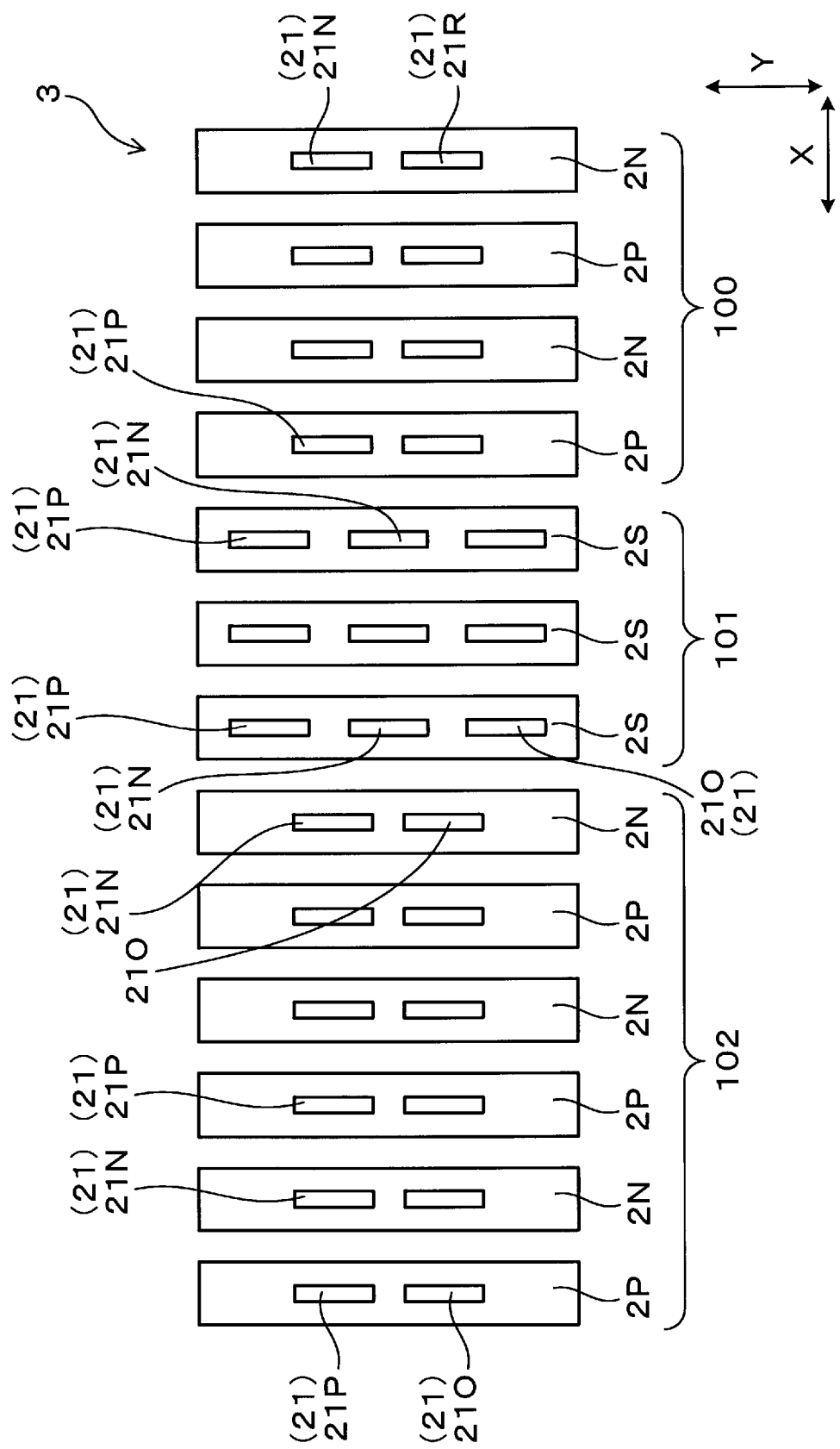
FIG. 5 is a plan view of a layered portion according to first embodiment.

As illustrated in FIG. 5, a plurality of semiconductor modules including the first semiconductor modules 2P, the second semiconductor modules 2N and the third semiconductor modules 2S are layered to constitute a layered portion 3.

As illustrated in FIGS. 2 to 4, each of the plurality of semiconductor modules 2P, 2N, and 2S includes a plurality of power terminals 21 protruding in one direction along a vertical direction Z orthogonal to a layering direction X of the layered portion 3.

Figure 6:
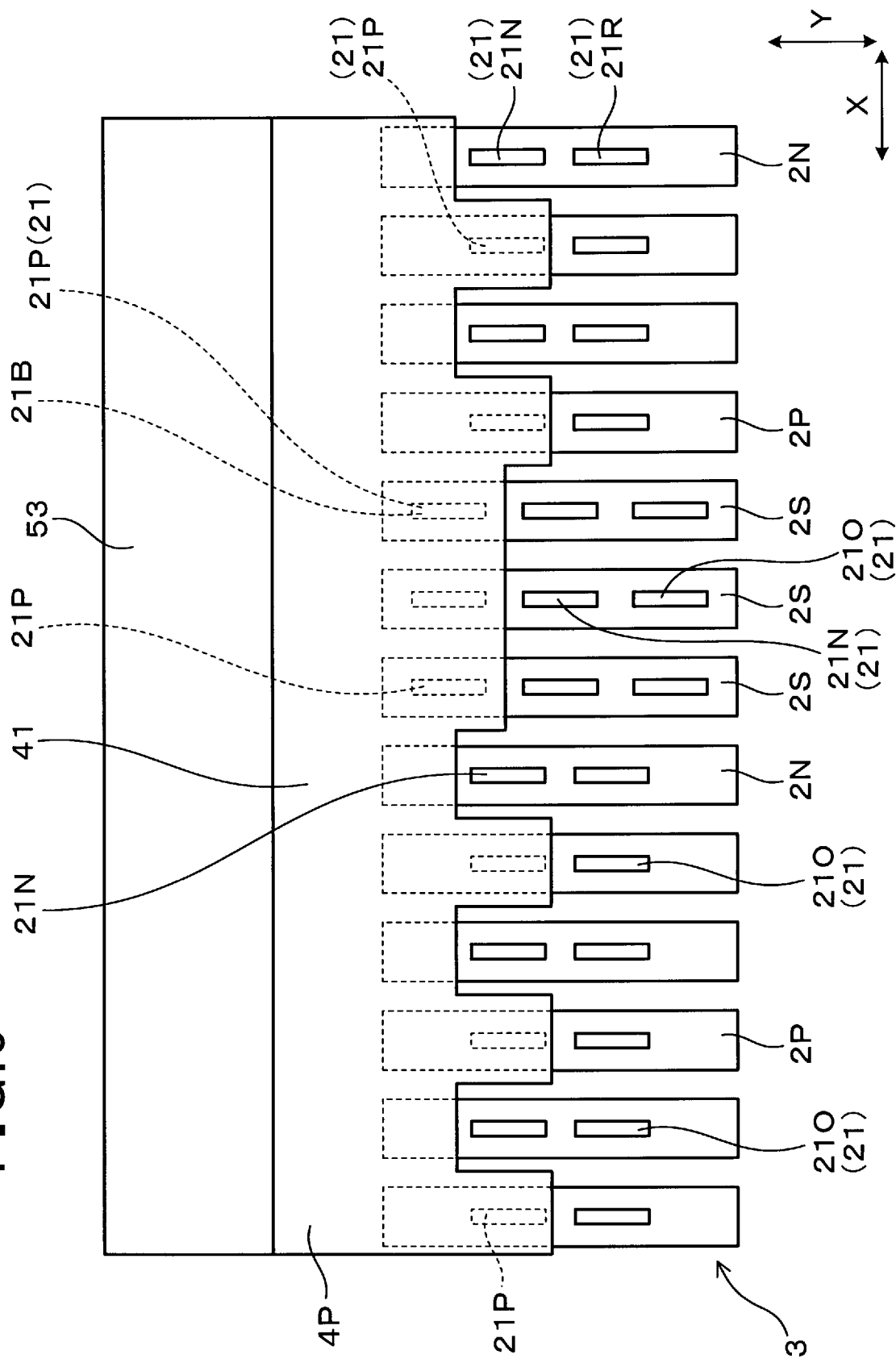
FIG. 6 is a plan view of the layered portion, a capacitor, and a positive electrode bus bar.

As illustrated in FIG. 2 and FIG. 6, the positive electrode bus bar 4P and the negative electrode bus bar 4N include respective bus bar body portions 41 on one side with respect to points of connection to the power terminals 21 in a lateral direction Y. Lateral direction Y refers to the direction orthogonal to both the layering direction X and the vertical direction Z. Note that, in FIG. 6, the negative electrode bus bar 4N, and an output bus bar 4O and a reactor bus bar 4R described below are omitted.

The positive electrode bus bar 4P and the negative electrode bus bar 4N connect the semiconductor modules 2P, 2N, and 2S to a capacitor 53. The capacitor 53 includes the above-described smoothing capacitor 531 and a filter capacitor 532. The capacitor 53 is disposed on one side with respect to the layered portion 3 in the lateral direction Y. The positive electrode bus bar 4P and the negative electrode bus bar 4N each include the bus bar body portion 41 on one side, in the lateral direction Y, with respect to connection portions connected to the power terminals 21. In the present embodiment, the bus bar body portion 41 is disposed between the layered portion 3 and the capacitor 53.

Figure 7:
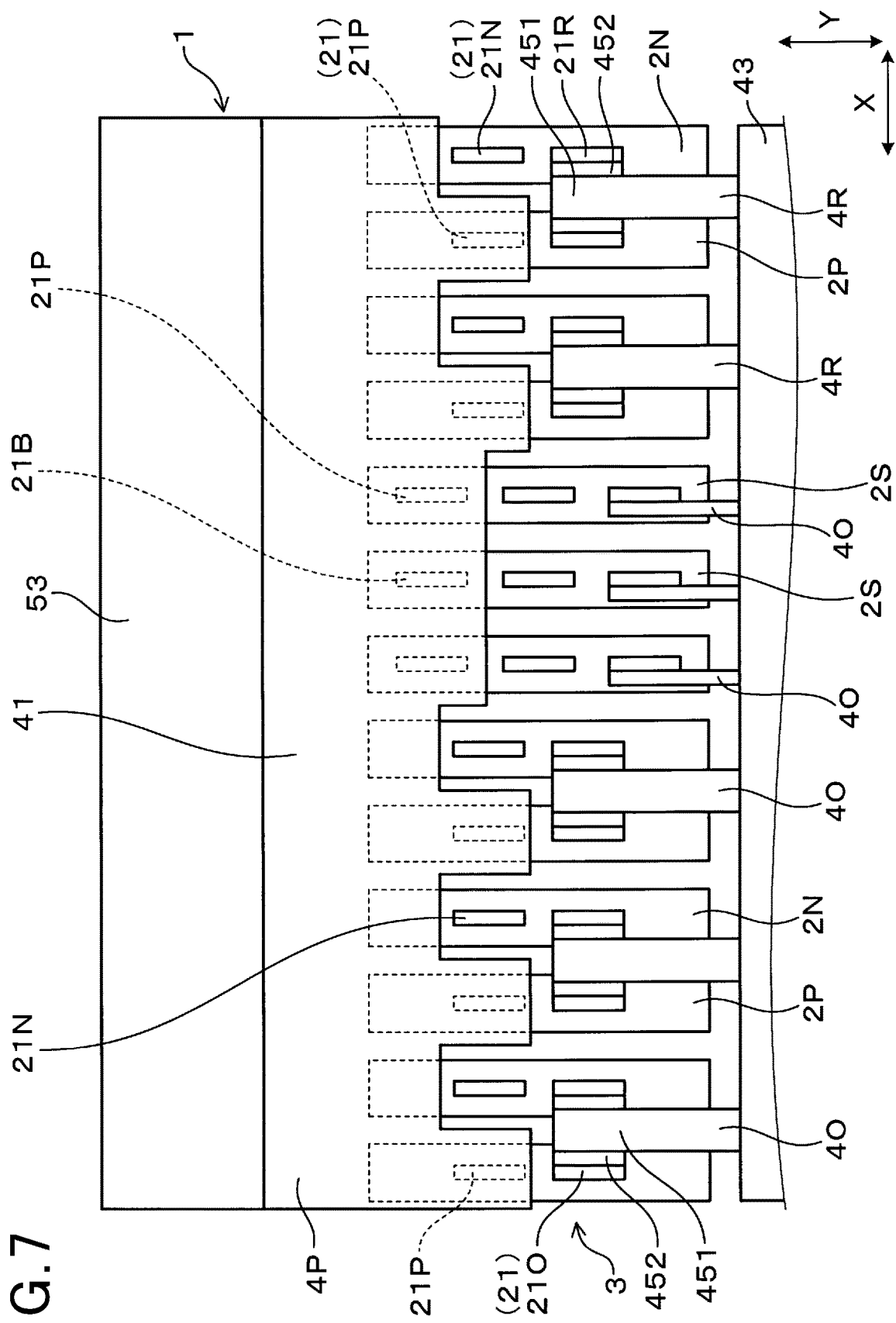
FIG. 7 is a plan view of the power conversion device from which a negative electrode bus bar is omitted according to first embodiment.

As illustrated in FIGS. 5 to 7, output terminals 21O included in the plurality of power terminals 21 and connected to the output wiring are disposed farthest from the bus bar body portion 41 in the lateral direction Y.

Positive electrode terminals 21P included in the plurality of power terminals 21 and connected to the positive electrode bus bar 4P and negative electrode terminals 21N also included in the plurality of power terminals 21 and connected to the positive electrode bus bar 4N are disposed closest to the bus bar body portion 41 in the lateral direction Y. In the present embodiment, the positive electrode terminals 21P are disposed closest to the bus bar body portion 41 in the lateral direction Y.

The power terminals 21 in the third semiconductor module 2S disposed closest to the bus bar body portion 41 are designated as reference terminals 21B. In the present embodiment, the power terminals 21 used as the reference terminals 21B are the positive electrode terminals 21P.

Of the power terminals corresponding to the positive electrode terminals 21P of the first semiconductor modules 2P and the negative electrode terminals 21N of the second semiconductor modules 2N, the power terminals 21 having a potential different from that of the reference terminals 21B are each disposed at the same position as that of the reference terminal 21B or positioned farther from the bus bar body portion 41 than the reference terminal 21B, in the lateral direction Y.

In the present embodiment, as described above, the reference terminals 21B are the positive electrode terminals 21P, and thus, the power terminals 21 having a potential different from that of the reference terminals 21B, that is, the negative electrode terminals 21N of the second semiconductor modules 2N are each disposed at the same position as that of the reference terminal 21B or positioned farther from the bus bar body portion 41 than the reference terminal 21B, in the lateral direction Y.

However, in the present embodiment, the positive electrode terminal 21P of each first semiconductor module 2P are also disposed at the same position as that of the negative electrode terminal 21N of each second semiconductor module 2N in the lateral direction Y. Furthermore, in the present embodiment, the negative electrode terminal 21N of each second semiconductor modules 2N is positioned farther from the bus bar body portion 41 than the reference terminal 21B. Accordingly, the positive electrode terminal 21P of each first semiconductor modules 2P is also positioned farther from the bus bar body portion 41 than the reference terminal 21B.

As illustrated in FIG. 5, the layered portion 3 includes a plurality of the first semiconductor modules 2P, a plurality of the second semiconductor modules 2N, and a plurality of the third semiconductor modules 2S; all the semiconductor modules are layered. Additionally, the semiconductor modules constituting the booster circuit unit 100, the semiconductor modules constituting the first inverter circuit unit 101, and the semiconductor modules constituting the second inverter circuit unit 102 are layered in a straight line. Note that, although not illustrated, a cooling pipe is interposed between the semiconductor modules adjacent to each other in the layering direction X. The cooling pipe is disposed on both principal surfaces of each of the semiconductor modules 2P, 2N, and 2S to cool the semiconductor module from both principal surfaces.

In the layered portion 3, the three third semiconductor modules 2S constituting the first inverter circuit unit 101 are contiguously layered. On one side with respect to the third semiconductor modules 2S in the layering direction X, six semiconductor modules 2P and 2N constituting the second inverter circuit unit 102 are layered. The six semiconductor modules include the first semiconductor modules 2P and the second semiconductor modules 2N. The first semiconductor modules 2P and the second semiconductor modules 2N are alternately layered. Additionally, on the other side with respect to the third semiconductor modules 2S in the layering direction X, four semiconductor modules 2P and 2N constituting the booster circuit unit 100 are layered. Also for the four semiconductor modules, the first semiconductor modules 2P and the second semiconductor modules 2N are alternately layered.

As illustrated in FIG. 7, the semiconductor modules 2P and 2N constituting the booster circuit unit 100 include intermediate potential terminals 21R connected to reactor bus bars 4R used as connection wiring connected to the reactor 54. In other words, the first semiconductor modules 2P in the booster circuit unit 100 include the positive electrode terminals 21P and the intermediate potential terminals 21R as power terminals 21. Additionally, the second semiconductor modules 2N in the booster circuit unit 100 include the negative electrode terminals 21N and the intermediate potential terminals 21R as the power terminals 21.

Additionally, in the lateral direction Y, the output terminal 21O in each first semiconductor module 2P and the output terminal 21O in each second semiconductor module 2N are disposed at the same position as that of the output terminal 21O in each third semiconductor module 2S or at a position closer to the bus bar body portion 41 than the output terminal 21O in each third semiconductor module 2S. In the present embodiment, the output terminal 21O in each first semiconductor module 2P and the output terminal 21O in each second semiconductor module 2N are positioned closer to the bus bar body portion 41 than the output terminal 21O in each third semiconductor module 2S is.

Figure 8:
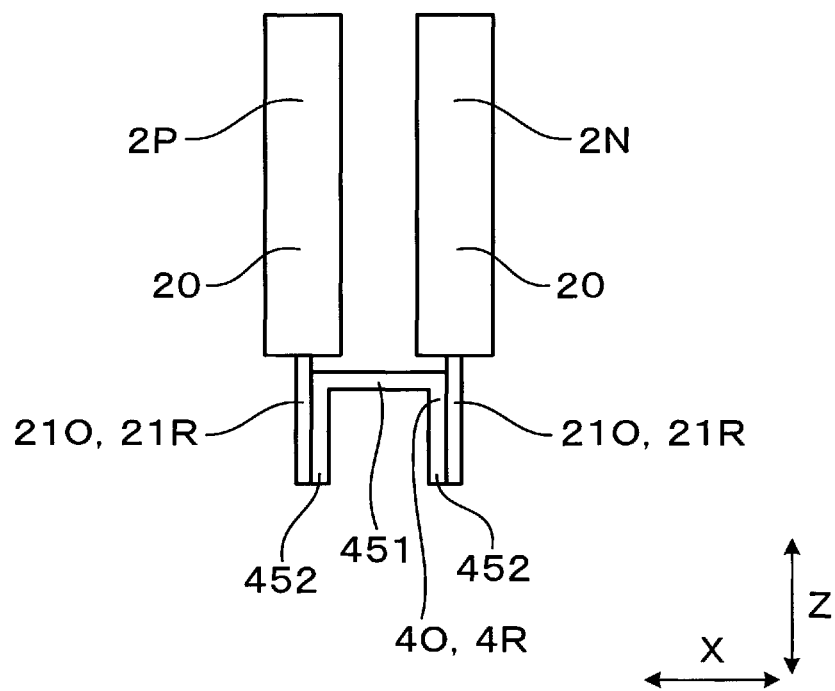
FIG. 8 is a side view of the first and second semiconductor modules and an output bus bar or a reactor bus bar according to first embodiment.

As illustrated in FIG. 7, the output terminals 21O connect to output bus bars 4O constituting output wiring to the rotating electrical machines 521 and 522. The output bus bars 4O are disposed to extend opposite to the bus bar body portion 41 with respect to the output terminals 21O in the lateral direction Y. As illustrated in FIG. 8, the output bus bars 4O includes a substrate portion 451 including a principal surface facing the vertical direction Z and a pair of erected portions 452 standing from the substrate portion 451 in the vertical direction Z. As illustrated in FIG. 7, the substrate portion 451 extending opposite to the bus bar body portion 41 in the lateral direction Y. The erected portion 452 connects to the output terminals 21O.

Additionally, as illustrated in FIG. 7, the reactor bus bars 4R are connected to the semiconductor modules 2P and 2N constituting the booster circuit unit 100 at an intermediate potential terminals 21R. The reactor bus bars 4R are also disposed to extend opposite to the bus bar body portion 41 with respect to the intermediate potential terminals 21R in the lateral direction Y. Additionally, the reactor bus bars 4R are shaped substantially similarly to the output bus bars 4O. That is, as illustrated in FIG. 8, each of the reactor bus bars 4R also includes the substrate portion 451 and the pair of erected portions 452. The intermediate potential terminals 21R are connected to the erected portions 452.

Additionally, the plurality of output bus bars 4O and the plurality of reactor bus bars 4R are integrated together with a resin portion 43 while being insulated. The resin portion 43 is provided with current sensors not illustrated. Some of the current sensors detect current flowing through the output bus bars 4O, and the others detect current flowing through the reactor bus bars 4R.

Figure 9:
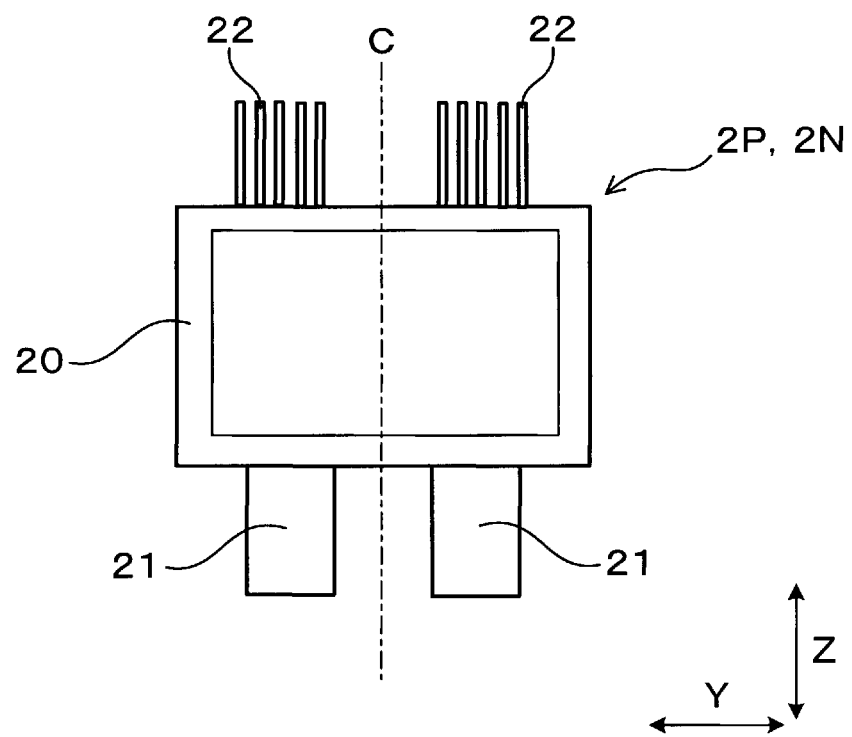
FIG. 9 is a plan view of the first semiconductor module or the second semiconductor module according to first embodiment.

As illustrated in FIG. 9, each of the first semiconductor modules 2P and the second semiconductor modules 2N includes a module body portion 20 and two power terminals 21 protruding in one direction along the vertical direction Z from the module body portion 20. As viewed in the layering direction X, the two power terminals 21 are disposed on opposing sides across a center line C passing through the center of the semiconductor module in the lateral direction Y.

The first semiconductor module 2P and the second semiconductor module 2N have the same structure. These semiconductor modules having the same structure are layered inverted with respect to each other through 180° around the center axis C. The first semiconductor module 2P and the second semiconductor module 2N are the same both in internal structure and in external structure.

In other words, semiconductor modules having the same part numbers are used as the first semiconductor module 2P and the second semiconductor module 2N. In a case where the first semiconductor module 2P and the second semiconductor module 2N are layered in the layered portion 3, the first semiconductor module 2P and the second semiconductor module 2N are inverted with respect to each other around the center line C. Then, the power terminals 21 utilized as output terminal 21O are disposed on the same side in the lateral direction Y.

In other words, the first semiconductor module 2P and the second semiconductor module 2N each include parallel-connected switching elements. One of the power terminals 21 is connected to collectors of the switching elements, and the other power terminal 21 is connected to emitters of the switching elements.

Accordingly, in a case where two semiconductor modules of the same structure are layered and disposed in the same orientation, the power terminal 21 connected to the collectors and the power terminal 21 connected to the emitters are disposed on the same side in the lateral direction Y. On the other hand, the output terminal 21O of the first semiconductor module 2P needs to be the power terminal 21 connected to the emitters of the upper-arm switching elements 20u. The output terminal 21O of the second semiconductor module 2N needs to be the power terminal 21 connected to the collectors of the lower-arm switching elements 20d. Thus, in a case where two semiconductor modules of the same structure are layered and disposed in the same orientation to provide the first semiconductor module 2P and the second semiconductor module 2N, the power terminals 21 to be used as the output terminals 21O are not disposed on the same side in the lateral direction Y.

Thus, one of two semiconductor modules of the same structure is opposed to the other semiconductor module such that the first semiconductor module is inverted with respect to the second semiconductor module around the center line C. Then, the power terminal 21 connected to the emitters and the power terminal 21 connected to the collectors are disposed on the same side in the lateral direction Y. In other words, the output terminal 21O of the first semiconductor module 2P and the output terminal 21O of the second semiconductor module 2N are disposed on the same side in the lateral direction Y.

Such arrangement is similarly performed in the booster circuit unit 100. In other words, the first semiconductor module 2P and the second semiconductor module 2N are layered such that the intermediate potential terminals 21R are disposed on the same side in the lateral direction Y. That is, in a case where semiconductor modules of the same structure are used to provide the first semiconductor module 2P and the second semiconductor module 2N, the first semiconductor module 2P and the second semiconductor module 2N are layered with one of the semiconductor modules inverted with respect to the other semiconductor module around the center line C.

As is the case with the semiconductor modules constituting the second inverter circuit unit 102, the power terminal 21 connected to the emitters in the first semiconductor module 2P and the power terminal 21 connected to the collectors in the second semiconductor module 2N are each used as the intermediate potential terminal 21R. Accordingly, the above-described manner of layering with inversion allows the intermediate potential terminals 21R to be disposed on the same side in the lateral direction Y.

Additionally, the first semiconductor module 2P and the second semiconductor module 2N are each provided with two power terminals 21 at positions line symmetric with respect to the center line C. In addition, the first semiconductor module 2P and the second semiconductor module 2N each include a plurality of control terminals 22 protruding opposite to the protruding side of the power terminals 21. In the present embodiment, each of the first semiconductor module 2P and the second semiconductor module 2N, including the control terminals 22, have a line-symmetric shape with respect to center line C, serving as a symmetric axis.

As illustrated in FIG. 5, the positive electrode terminal 21P of each of the first semiconductor modules 2P and the negative electrode terminal 21N of the opposing second semiconductor modules 2N are opposed to each other in the layering direction X. In other words, as viewed in the layering direction X, the positive electrode terminals 21P overlap the negative electrode terminals 21N. In particular, in the present embodiment, as viewed in the vertical direction Z, the positive electrode terminals 21P of the first semiconductor modules 2P and the negative electrode terminals 21N of the second semiconductor modules 2N are aligned in a straight line along the layering direction X.

The output terminals 21O of the opposing first and second semiconductor modules 2P and 2N are opposed to each other in the layering direction X. In other words, as viewed in the layering direction X, the output terminals 21O overlap. In particular, in the present embodiment, as viewed in the vertical direction Z, the output terminals 21O of the first semiconductor modules 2P and the second semiconductor modules 2N are aligned in a straight line along the layering direction X.

Additionally, the intermediate potential terminals 21R of the opposing first and second semiconductor modules 2P and 2N included in the booster circuit unit 100 are opposed to each other in the layering direction X. In addition, in the present embodiment, the output terminals 21O in the semiconductor modules 2P and 2N constituting the second inverter circuit unit 102 and intermediate potential terminals 21R in the semiconductor modules 2P and 2N constituting the booster circuit unit 100 are aligned in a straight line along the layering direction X.

Additionally, the positive electrode terminals 21P and the negative electrode terminals 21N are aligned in a straight line along the layering direction X between the semiconductor modules 2P and 2N constituting the booster circuit unit 100 and the semiconductor modules 2P and 2N constituting the second inverter circuit unit 102.

Note that, in the present embodiment, the power terminals 21 of the third semiconductor modules 2S constituting the first inverter circuit unit 101 are not aligned with the power terminals 21 in the booster circuit unit 100 or the power terminals 21 in the second inverter circuit unit 102 in the lateral direction Y.

Figure 10:
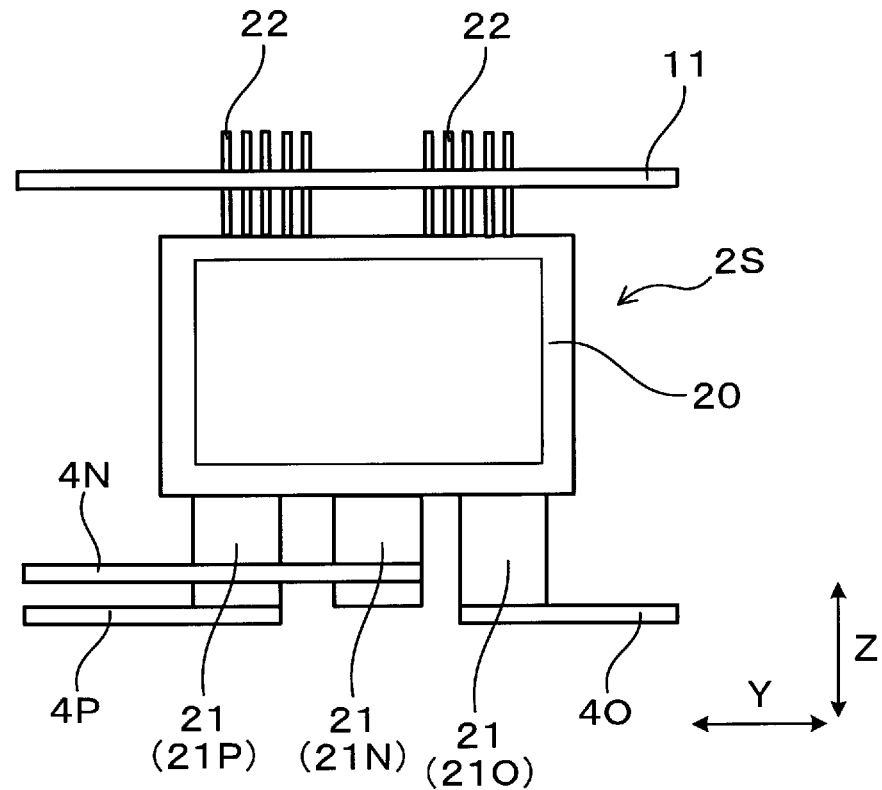
FIG. 10 is a front view of the third semiconductor module, a circuit board, and the bus bars according to first embodiment.
Figure 11:
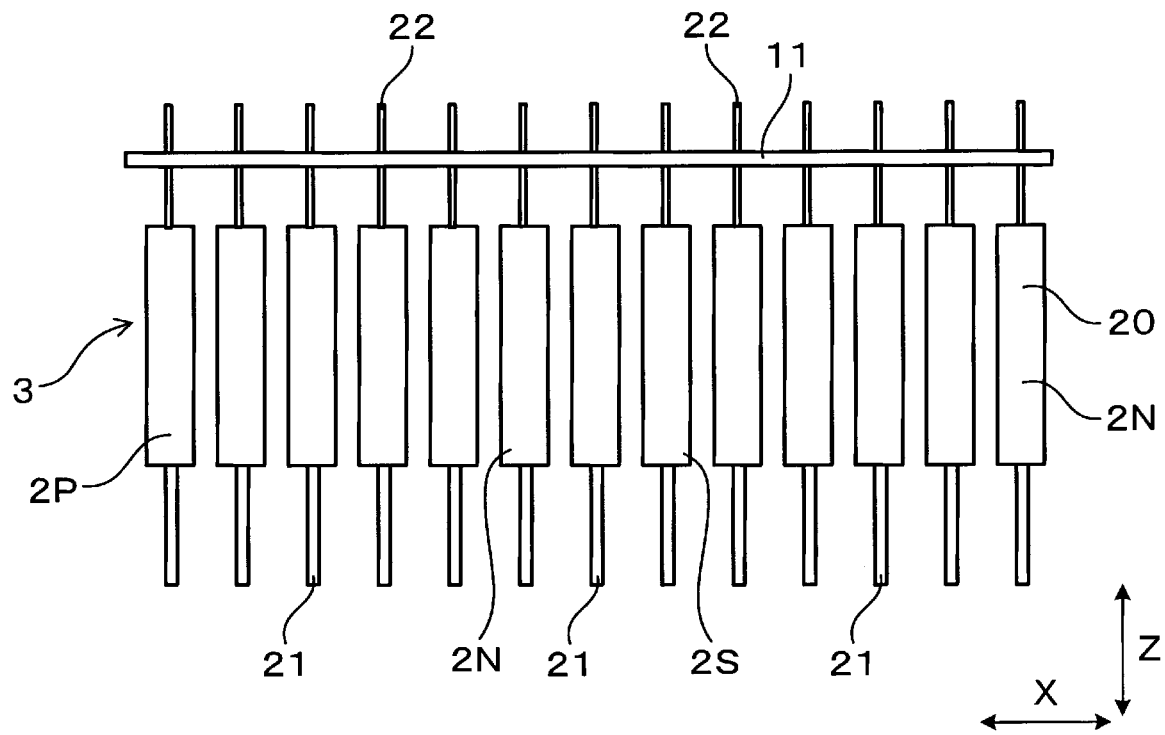
FIG. 11 is a side view of the layered portion and the circuit board according to first embodiment.

As illustrated in FIGS. 10 and 11, the power conversion device 1 includes a circuit board 11 including a driving circuit driving the switching circuit unit. The first semiconductor modules 2P, the second semiconductor modules 2N, and the third semiconductor modules 2S each include the power terminal 21 protruding opposite to the circuit board 11. That is, the circuit board 11 is opposed to the protruding side of the power terminals 21 with respect to the layered portion 3 in the vertical direction Z. The principal surface of the circuit board 11 opposes the layered portion 3 is the vertical direction Z.

As illustrated in FIGS. 9 to 11, each of the semiconductor modules 2P, 2N, and 2S include a plurality of control terminals 22 protruding from the module body portion 20. The control terminals 22 protrude opposite to the power terminal 21 in the Z direction. The control terminals 22 are connected to the circuit board 11. Some of the control terminals 22 are electrically connected to gates of the switching elements 20u and 20d in the semiconductor module.

Now, functions and effects of the present embodiment will be described.

The power conversion device 1 includes the first semiconductor modules 2P, the second semiconductor modules 2N, and the third semiconductor modules 2S. This facilitates a reduction in the loss in the power conversion device and in the size and cost thereof.

First, the first semiconductor modules 2P, the second semiconductor modules 2N, and the third semiconductor modules 2S each incorporate a plurality of intensively arranged switching elements. This facilitates a reduction in the size and costs of the power conversion device 1.

Additionally, in the power conversion device 1, the first semiconductor modules 2P or the second semiconductor modules 2N are used for the arm through which a relatively large amount of current flows, to be adapted for a large current. Furthermore, the first semiconductor modules 2P and the second semiconductor modules 2N each incorporate a plurality of parallel-connected switching elements. This enables a reduction in the length of the connection wiring between the switching elements connected together in parallel in each of the semiconductor modules 2P and 2N. As a result, inductance in the connection wiring can be reduced. Accordingly, switching loss can be reduced. Note that, in this regard, refer to a comparative embodiment described below.

Additionally, the third semiconductor modules 2S are used for the arm through which a relatively small amount of current flows, enabling a reduction in the number of semiconductor modules in the power conversion device 1. As a result, the size and cost of the power conversion device 1 can be reduced.

In this way, the power conversion device 1 includes the first semiconductor modules 2P, the second semiconductor modules 2N, and the third semiconductor modules 2S, facilitating a reduction in loss, size, and cost.

The negative electrode terminal 21N of each first semiconductor module is positioned farther from the bus bar body portion 41 than the positive electrode terminal 21P of each third semiconductor module 2S, used as the reference terminal 21B. That is, of the power terminals corresponding to the positive electrode terminals 21P of the first semiconductor module 2P and the negative electrode terminals 21N of the second semiconductor module 2N, the power terminals 21 having a potential different from that of the reference terminals 21B are each disposed at the same position as that of the reference terminal 21B or positioned farther from the bus bar body portion 41 than the reference terminal 21B, in the lateral direction Y. This enables a reduction in the distance of a current path between the plurality of power terminals 21 of the same potential via the bus bars 4.

Figure 12:
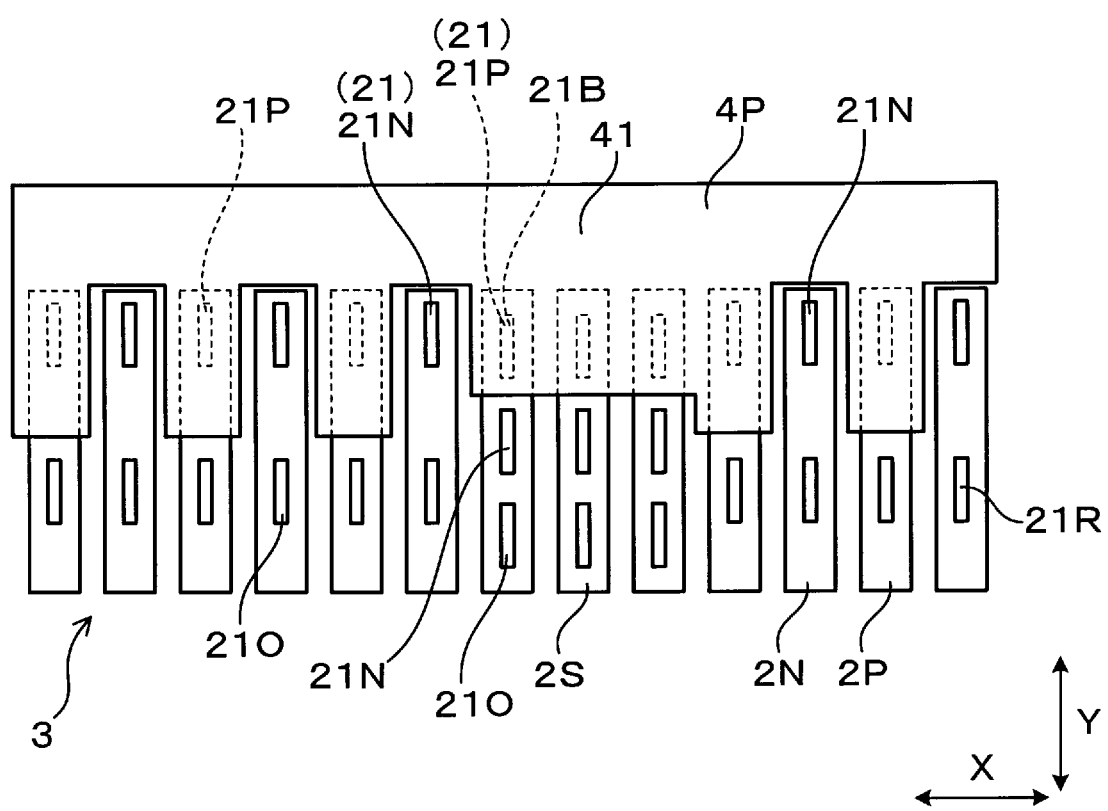
FIG. 12 is a plan view illustrating that a positive electrode terminal of the first semiconductor module and a negative electrode terminal of the second semiconductor module are disposed closer to a bus bar body portion.

In other words, for example, it is assumed that, as illustrated in FIG. 12, the power terminals 21 (for example, the negative electrode terminals 21N) having a potential different from that of the reference terminal 21B are closer in the lateral direction Y to the bus bar body portion 41 than the reference terminal 21B. In this case, when a bus bar (positive electrode bus bar 4P) of the same potential as that of the reference terminal 21B is formed so as to avoid the power terminals 21 (in this case, the negative electrode terminals 21N), a long current path is likely to be formed between the power terminals 21 of the same potential (in this case, the positive electrode terminals 21P). In contrast, arrangement of the power terminals 21 as in the present embodiment illustrated in FIG. 7 allows prevention of a long current path between the power terminals 21 (in the present embodiment, the positive electrode terminals 21P) via the bus bar (in the present embodiment, the positive electrode bus bar 4P).

In the present embodiment, as described above, the negative electrode terminal 21N of each first semiconductor modules 2P is positioned farther from the bus bar body portion 41 than the positive electrode terminal 21P of each third semiconductor modules 2S, used as the reference terminal 21B. This enables a further reduction in the distance between the positive electrode terminals 21P via the positive electrode bus bar 4P.

Additionally, in the lateral direction Y, the output terminal 21O in each first semiconductor module 2P and the output terminal 21O in each second semiconductor module 2N are disposed at the same position as that of the output terminal 21O in each third semiconductor modules 2S or at a position closer to the bus bar body portion 41 than the output terminal 21O in each third semiconductor modules 2S. Accordingly, all the output bus bars 4O connected to each first semiconductor modules 2P and each second semiconductor modules 2N can be easily disposed closer to a central side of the layered portion 3 in the lateral direction Y. As a result, the present embodiment facilitates a reduction in the size of the power conversion device 1 in the lateral direction Y.

That is, a case is assumed where the output terminals 21O in each first semiconductor modules 2P and each second semiconductor modules 2N are positioned farther from the bus bar body portion 41 than the output terminal 21O in each third semiconductor modules 2S. In this case, all the output bus bars 4O connected to the first semiconductor modules 2P and the second semiconductor modules 2N may be positioned farther from the center of the layered portion 3 than the output bus bars 4O connected to the third semiconductor modules 2S. Then, the size of the power conversion device 1 in the lateral direction Y may be increased. In contrast, a reduction in the size of the power conversion device 1 is facilitated by arrangement of the output terminal 21O in the first semiconductor modules 2P and the second semiconductor modules 2N as in the present embodiment.

In particular, in the present embodiment, the output terminals 21O in each first semiconductor modules 2P and each second semiconductor modules 2N are positioned closer to the bus bar body portion 41 than the output terminal 21O in each third semiconductor modules 2S. Accordingly, a reduction in the size of the power conversion device 1 in the lateral direction Y is further facilitated. That is, in this case, for example, even with dimensional tolerances of the output terminals 21O in the first semiconductor modules 2P and the second semiconductor modules 2N taken into account, the output bus bars 4O connected to the first semiconductor modules 2P and the second semiconductor modules 2N are less likely to be located away from the center of the layered portion 3 in the lateral direction Y. As a result, even with the dimensional tolerances taken into account, a reduction in the size of the power conversion device 1 is facilitated.

In a case where each of the first semiconductor modules 2P and the second semiconductor modules 2N is viewed in the layering direction X, the two power terminals 21 are disposed on opposite sides across the center line C. This facilitates adjustment of mass balance of each of the first semiconductor modules 2P and the second semiconductor modules 2N in the lateral direction Y. Accordingly, improvement of vibration resistance of the layered portion 3 is facilitated.

The first semiconductor module 2P and the second semiconductor module 2N have the same structure. The semiconductor modules of the same structure are layered inverted with respect to each other around the center axis C. This enables a reduction in the cost of the power conversion device 1. That is, compared to a configuration in which the first semiconductor module 2P and the second semiconductor module 2N have different structures, the present configuration enables a reduction in cost. Additionally, by inverting semiconductor modules of the same structure with respect to each other to provide the first semiconductor module 2P and the second semiconductor module 2N, the output terminals 21O can be disposed close to each other, as described above. Similarly, the positive electrode terminals 21P can be disposed on the same side, in the lateral direction Y, as that on which the negative electrode terminals 21N are disposed. As a result, the present configuration allows simplification of a connection structure of connections between the positive electrode bus bar 4P, negative electrode bus bar 4N, and output bus bars 4O and the semiconductor modules 2P, 2N, and 2S.

The positive electrode terminal 21P of the first semiconductor module 2P and the negative electrode terminal 21N of the opposing second semiconductor module 2N are opposed to each other in the layering direction X. This enables a reduction in the inductance between the positive electrode terminal 21P and the negative electrode terminal 21N opposed to each other. As a result, the inductance of the switching circuit unit can be reduced.

The output terminals 21O of the opposing first and second semiconductor modules 2P and 2N are opposed to each other in the layering direction X. This enables a reduction in the inductance between the pair of output terminals 21O opposed to each other. As a result, the inductance of the switching circuit unit can be reduced.

The first semiconductor modules 2P, the second semiconductor modules 2N, and the third semiconductor modules 2S each include the power terminal 21 protruding opposite to the circuit board 11. That is, the circuit board 11 is opposed to the protruding side of the power terminal 21 with respect to the layered portion 3 in the vertical direction Z. This allows suppression of adverse effect, on the circuit board 11, of noise caused by a current flowing through the power terminal 21 and the bus bar connected to the power terminal 21

Figure 13:
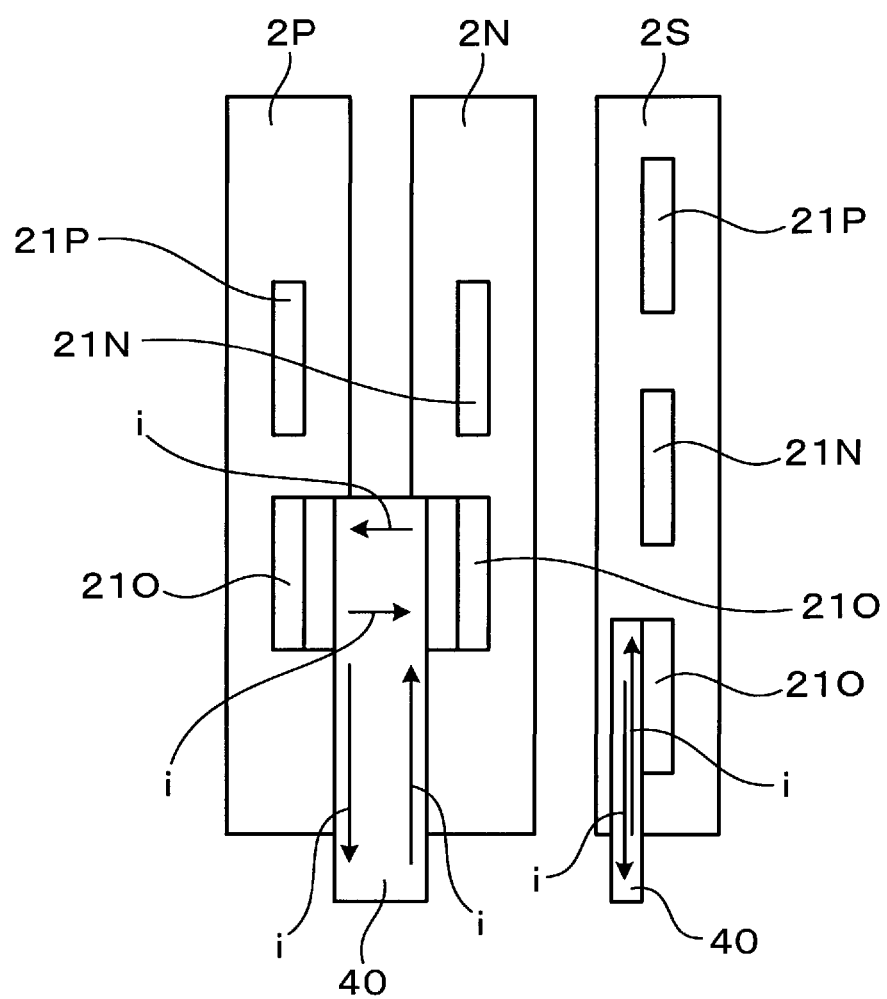
FIG. 13 is a descriptive diagram of a current path in an output bus bar according to first embodiment.

In particular, a path of a current i flowing through the output bus bars 4O connected to the output terminals 21O of the first semiconductor modules 2P and the second semiconductor modules 2N is present, as illustrated in FIG. 13, not only along the lateral direction Y but also along the layering direction X. Thus, given that the circuit board 11 is disposed on the same side as that on which the output bus bars 4O are disposed, prevention of the adverse effect of noise is difficult even with the orientation of the wiring on the circuit board 11 modified. Accordingly, by disposing the circuit board 11 on the opposite side across the layered portion 3 in the vertical direction Z, the adverse effect of noise on the circuit board 11 can be effectively suppressed.

As described above, according to the present embodiment, a power conversion device can be provided that can facilitate a reduction in loss, size, and cost.

Second Embodiment

Figure 14:
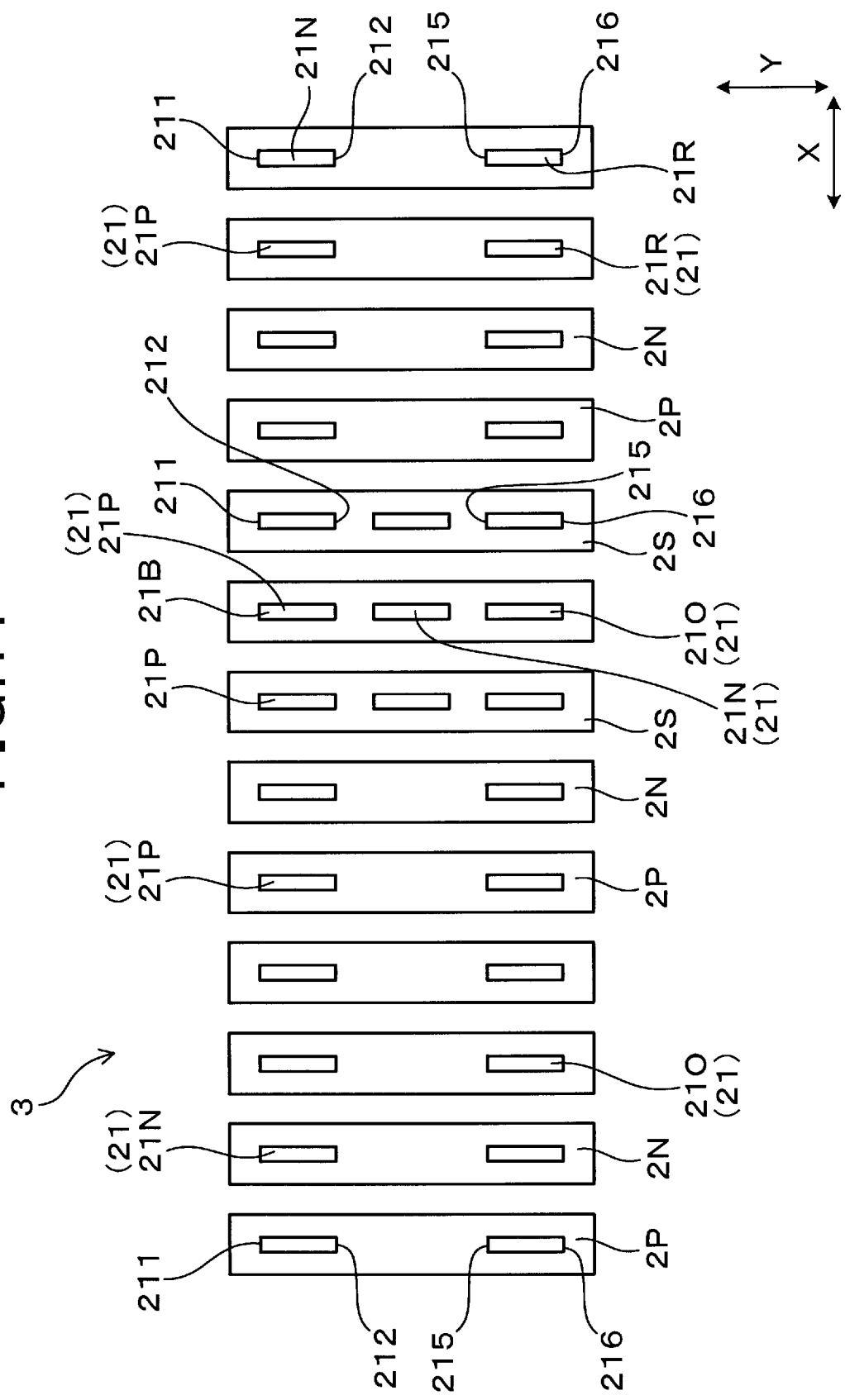
FIG. 14 is a plan view of a layered portion according to a second embodiment.

In the present embodiment of the power conversion device 1, as illustrated in FIG. 14, two power terminals 21 disposed at opposing ends in the lateral direction Y are located at the same positions in the lateral direction Y in the plurality of semiconductor modules 2P, 2N, and 2S.

That is, as illustrated in FIG. 14, the positive electrode terminal 21P of each first semiconductor module 2P and the negative electrode terminal 21N of each second semiconductor module 2N are disposed at the same position, in the lateral direction Y, as that of the positive electrode terminal 21P of each third semiconductor module 2S, used as the reference terminal 21B. The positive electrode terminals 21P of the first semiconductor modules 2P, the negative electrode terminals 21N of the second semiconductor modules 2N, and the positive electrode terminals 21P of the third semiconductor modules 2S are aligned in a straight line along the layering direction X.

Additionally, the output terminal 21O of each first semiconductor module 2P and the output terminal 21O of each second semiconductor module 2N are disposed at the same position as that of the output terminal 21O of each third semiconductor module 2S in the lateral direction Y. The output terminals 21O of the first semiconductor modules 2P, the output terminals 21O of the second semiconductor modules 2N, and the output terminals 21O of the third semiconductor modules 2S are aligned in a straight line along the layering direction X.

Additionally, in the plurality of semiconductor modules, at least two edges (211 and 212, 215 and 216) included in the edges of the plurality of power terminals 21 in the lateral direction Y and facing opposite directions are disposed overlapping each other in the layering direction X.

In particular, in the present embodiment, the positive electrode terminal 21P of each first semiconductor module, the negative electrode terminal 21N of each second semiconductor module 2N, and the positive electrode terminal 21P of each third semiconductor module 2S are disposed overlapping one another at both ends 211 and 212 of the terminals in the layering direction X. Furthermore, the output terminal 21O of each first semiconductor module 2P, the output terminal 21O of each second semiconductor module 2N, and the output terminal 21P of each third semiconductor module 2S are disposed overlapping one another at both ends 215 and 216 of the terminals in the layering direction X.

The remaining part of the configuration is similar to that in First embodiment. Note that the same reference numerals in Second embodiment and the subsequent embodiments as those in the above-described embodiment denote components and the like similar to those in the above-described embodiment unless otherwise specified.

In the present embodiment, both the positive electrode terminal 21P of each first semiconductor module 2P and the negative electrode terminal 21N of each second semiconductor module 2N are disposed at the same position as that of the reference terminal 21B in the lateral direction Y. Thus, one of power terminals corresponding to the positive electrode terminal 21P of each first semiconductor module 2P and the negative electrode terminal 21N of each second semiconductor module 2N, the power terminals having a potential different from that of the reference terminal 21B is disposed at the same position, in the lateral direction Y, as that of the reference terminal 21B. Accordingly, as described above in First embodiment, the distance of the current path between the power terminals 21 of the same potential can be easily reduced.

Additionally, in the present embodiment, the output terminals 21O of the first semiconductor module 2P and the second semiconductor module 2N are disposed at the same position, in the lateral direction Y, as that of the output terminal 21O of each third semiconductor module 2S. Accordingly, as described above in First embodiment, the size of the power conversion device 1 can be reduced.

Additionally, in the plurality of semiconductor modules, at least two edges (211 and 212, 215 and 216) included in the edges of the plurality of power terminals 21 in the lateral direction Y and facing opposite directions are disposed overlapping each other in the layering direction X. Thus, when the plurality of semiconductor modules are assembled in the layered portion 3, positioning in the lateral direction Y can be accurately achieved. That is, when the semiconductor modules are assembled in the layered portion 3, a positioning jig 6 is used as illustrated in FIG. 15.

Figure 15:
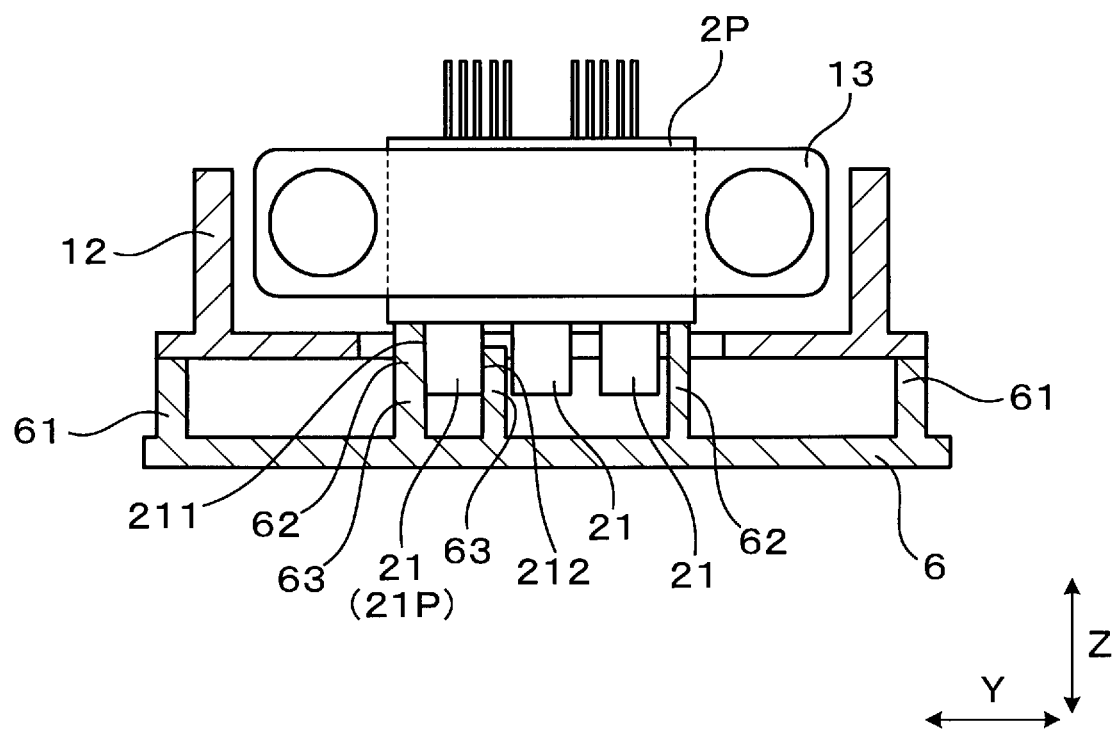
FIG. 15 is a descriptive diagram of a method for positioning semiconductor modules according to second embodiment.
Figure 16:
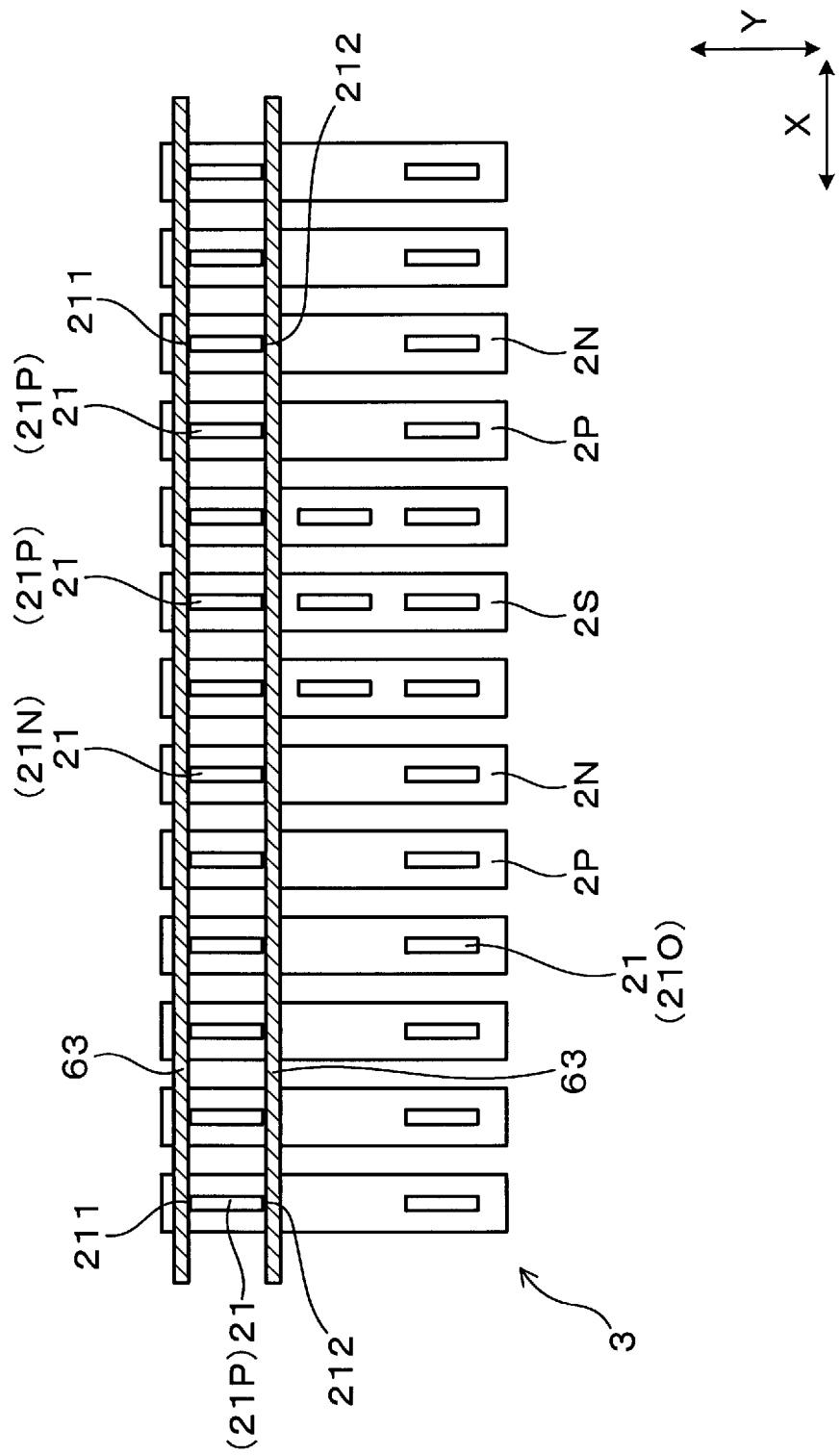
FIG. 16 is a descriptive diagram of the layered portion and a positioning portion according to second embodiment.

In other words, as illustrated in FIG. 15, the positioning jig 6 includes case bearing portions 61 bearing a case of the power conversion device 1 in the vertical direction Z, module bearing portions 62 bearing the semiconductor modules in the vertical direction Z, and positioning portions 63 positioning the semiconductor modules in the lateral direction Y. In the positioning jig 6 illustrated in FIG. 15, a part of the module bearing portions 62 is the same as a part of the positioning portions 63. As illustrated in FIG. 16, the positioning portions 63 are formed like straight lines so as to extend in the layering direction X.

The case 12 and the plurality of semiconductor modules 2P, 2N, and 2S are placed in the positioning jig 6 along with a cooler 13 and the like. At this time, the edges 211 and 212 of the power terminals 21 of the plurality of semiconductor modules 2P, 2N, and 2S are abutted against the positioning portion 63 from the lateral direction Y. That is, the power terminals 21 are interposed between the pair of positioning portions 63, and the edges 211 and 212 of the pair are abutted against each other in the lateral direction Y. Then, with reference to the edges 211 and 212, the plurality of semiconductor modules 2P, 2N, and 2S are positioned in the lateral direction Y with respect to the positioning jig 6. Since the positioning portions 63 are formed like straight lines in the layering direction X, the power terminals 21 of the plurality of semiconductor modules 2P, 2N, and 2S are also arranged in a straight line in the layering direction X.

Note that it is sufficient that the pair of edges of the power terminals 21 abutted against the positioning portions 63 face opposite directions in the lateral direction Y. That is, as a pair of edges for positioning, the pair of edges 215 and 216 of the output terminals 21O or the outer edges 211 and 216 of the power terminals 21 located at both ends in the lateral direction Y may be used. Alternatively, as a pair of edges, the inner edges 212 and 215 of the power terminals 21 located at both ends in the lateral direction Y may be used. Of course, the positioning portions 63 are repositioned.

As described above, the plurality of semiconductor modules 2P, 2N, and 2S can be easily positioned in the lateral direction Y. Additionally, the power terminals 21 of the plurality of semiconductor modules are arranged in a straight line in the layering direction X, allowing facilitation of an operation of connecting the power terminals to the bus bar. For example, in a case where the connection is made by welding, the operation can be easily performed. As a result, productivity of the power conversion device 1 can be improved.

The second embodiment otherwise has functions and effects similar to those of First embodiment.

Third Embodiment

Figure 17:
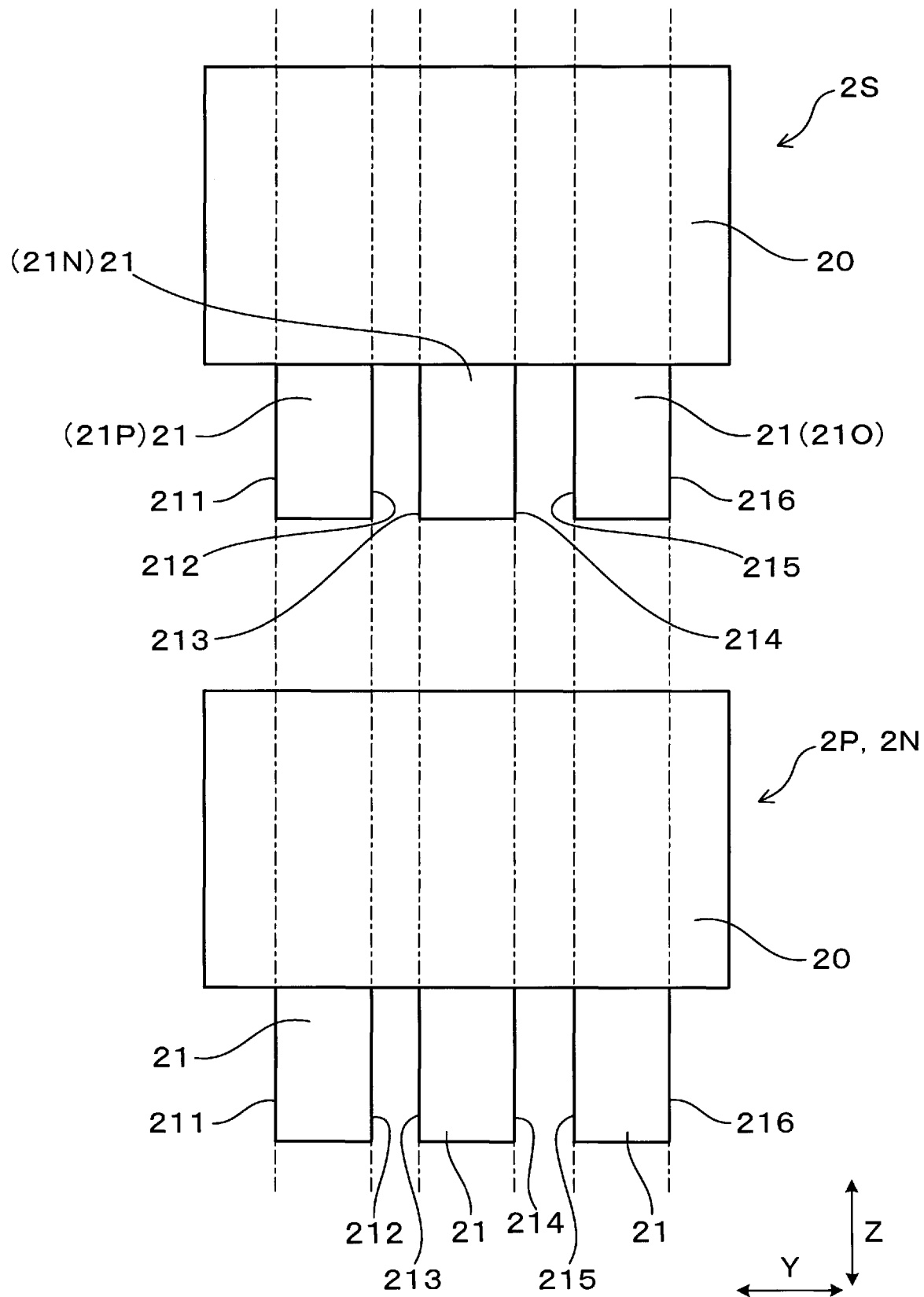
FIG. 17 is a front view illustrating semiconductor modules according to third embodiment.

In the present embodiment, variations of an array of the power terminals 21 and the width of the power terminal 21 in the lateral direction Y are disclosed as illustrated in FIG. 17.

Also in the present embodiment, in the plurality of semiconductor modules 2P, 2N, and 2S, at least two edges included in the edges of the plurality of power terminals 21 in the lateral direction Y and facing opposite directions are disposed overlapping each other in the layering direction X. Alternate long and short dash lines illustrated in FIG. 17 means that the edges along the long and short dash lines overlap one another among the plurality of semiconductor modules 2P, 2N, and 2S. This also applies to the same type of drawings described below.

As illustrated in FIG. 17, each of the first semiconductor modules 2P, the second semiconductor modules 2N, and the third semiconductor modules 2S includes three power terminals 21. The positions and number of the three power terminals 21 in the lateral direction Y are the same for any of the plurality of semiconductor modules 2P, 2N, and 2S constituting the layered portion 3. Thus, the edges of the three power terminals 21 in the lateral direction Y all overlap one another among the plurality of semiconductor modules 2P, 2N, and 2S. Accordingly, two of these edges that face opposite directions can be used to position the plurality of semiconductor modules in the lateral direction Y.

For example, as is the case with the positioning jig 6 illustrated in FIGS. 15 and 16 for Second embodiment, the pair of edges 211 and 212 of one power terminal 21 of each semiconductor module can be used for positioning. Other edges 213 to 216 can be appropriately used for positioning.

Note that any one or two of the three power terminals 21 of each of the first semiconductor module 2P and the second semiconductor module 2N can be connected to the collectors, with the remaining power terminals 21 connected to the emitters. Additionally, two of the three power terminals 21 located on both sides in the lateral direction Y are at the same potential. Accordingly, the output terminal 21O corresponds to each of two power terminals 21 included in the three power terminals 21 of each of the first semiconductor module 2P and the second semiconductor module 2N and located at both ends in the lateral direction Y, or one of the three power terminals 21 located at the center.

Third embodiment otherwise has a configuration, functions, and effects similar to those of Second embodiment.

Fourth Embodiment

Figure 18:
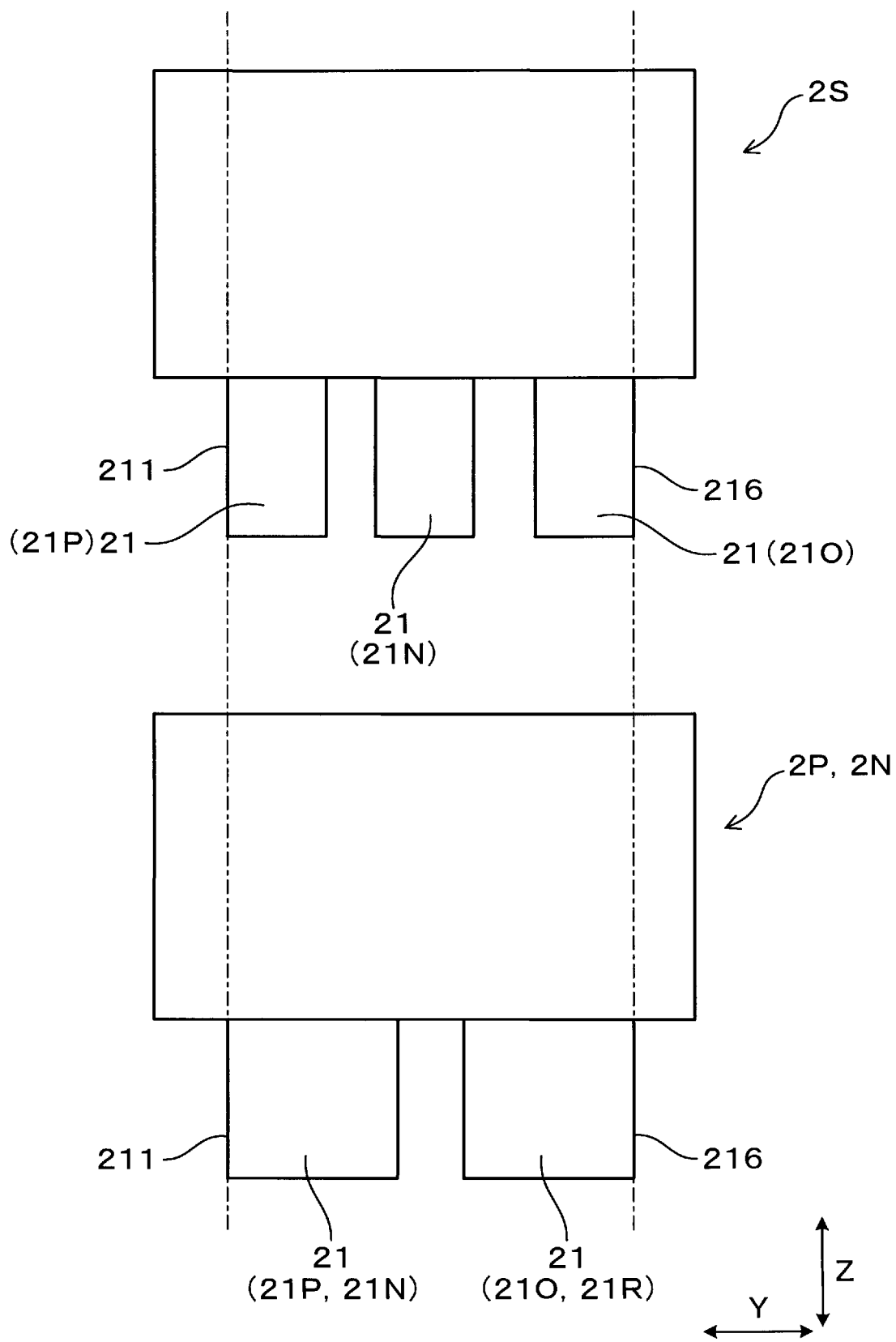
FIG. 18 is a front view illustrating semiconductor modules according to Fourth embodiment.
Figure 19:
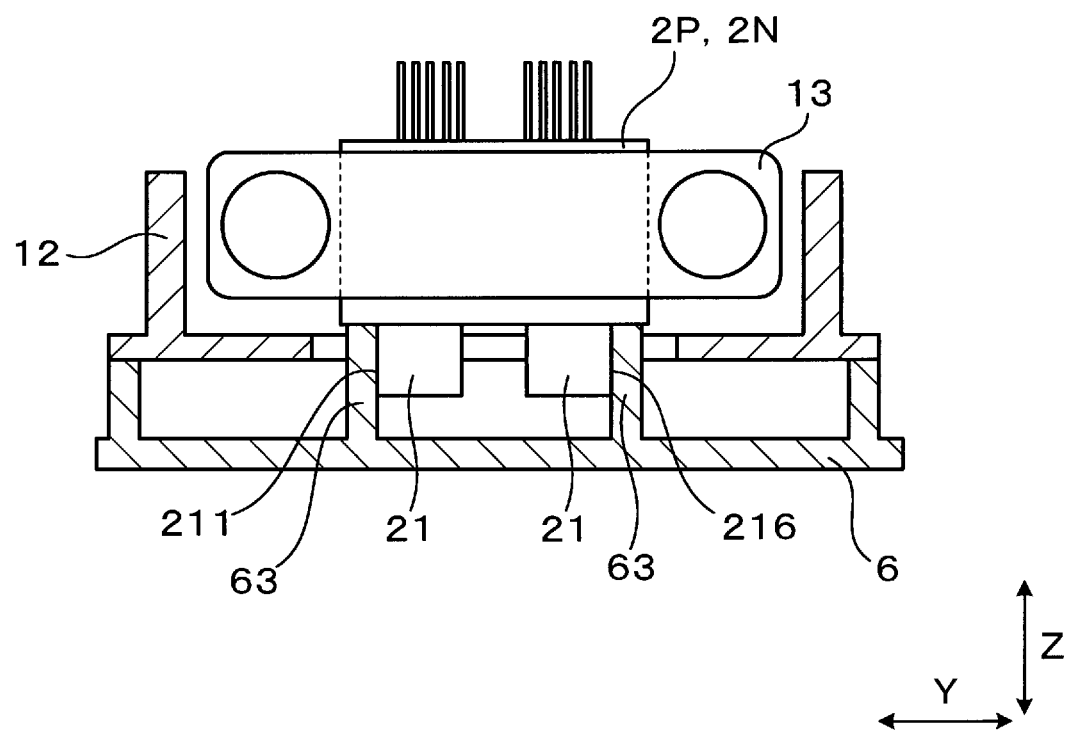
FIG. 19 is a descriptive diagram of a method for positioning semiconductor modules according to Fourth embodiment.

In the present embodiment, as illustrated in FIGS. 18 and 19, the outer edges 211 and 216 of the two power terminals 21 located at both ends in the lateral direction Y are aligned among the plurality of semiconductor modules 2P, 2N, and 2S.

In other words, for the first semiconductor modules 2P and the second semiconductor modules 2N, the pair of edges 211 and 216 of the two power terminals 21 which edges face opposite outward directions in the lateral direction Y are used for positioning. Additionally, for the third semiconductor modules 2S, the pair of edges 211 and 216 of the power terminals 21 located at both ends in the lateral direction Y are used for positioning.

Thus, as illustrated in FIG. 19, by abutting the edges 211 and 216 against the respective paired positioning portions 63 of the positioning jig 6, the plurality of semiconductor modules can be positioned in the lateral direction Y.

Additionally, the power terminals 21 of the first semiconductor modules 2P and the second semiconductor modules 2N are larger in the width in the lateral direction Y than the power terminals 21 of the third semiconductor modules 2S. This enables a further reduction in the inductance of the power terminals 21 of the first semiconductor modules 2P and the second semiconductor modules 2N.

Fourth embodiment otherwise has a configuration, functions, and effects similar to those of Second embodiment.

Fifth Embodiment

Figure 20:
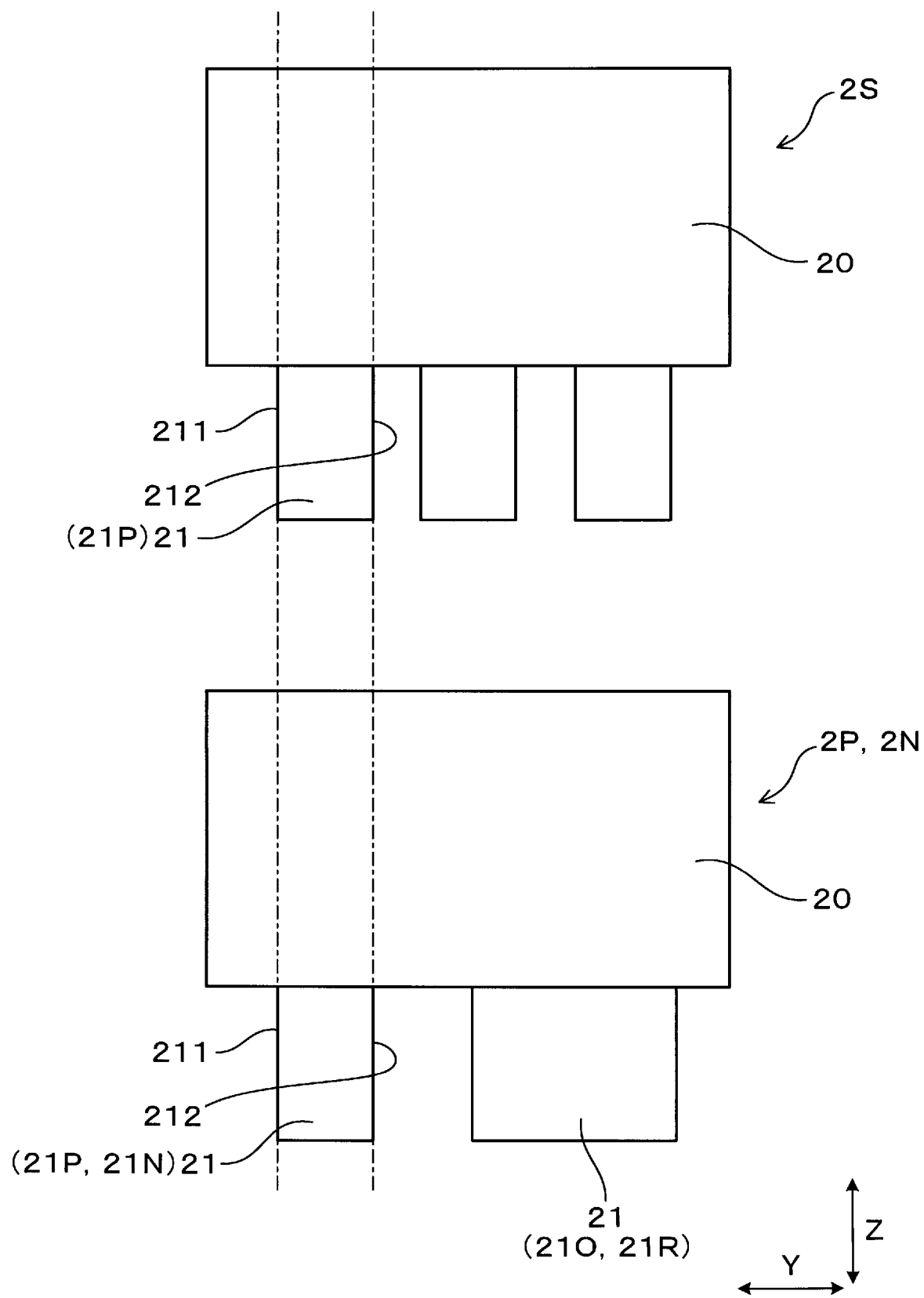
FIG. 20 is a front view illustrating semiconductor modules according to Fifth embodiment.

In the present embodiment, as illustrated in FIG. 20, the two edges 211 and 212 of the power terminal 21 located at one end in the lateral direction Y are aligned among the plurality of semiconductor modules 2P, 2N, and 2S.

That is, for example, the positive electrode terminal 21P of each first semiconductor module 2P, the negative electrode terminal 21N of each second negative electrode terminal 21N, and the positive electrode terminal 21P of each third semiconductor module 2S are provided at the same position in the lateral direction Y and have the same width.

Figure 21:
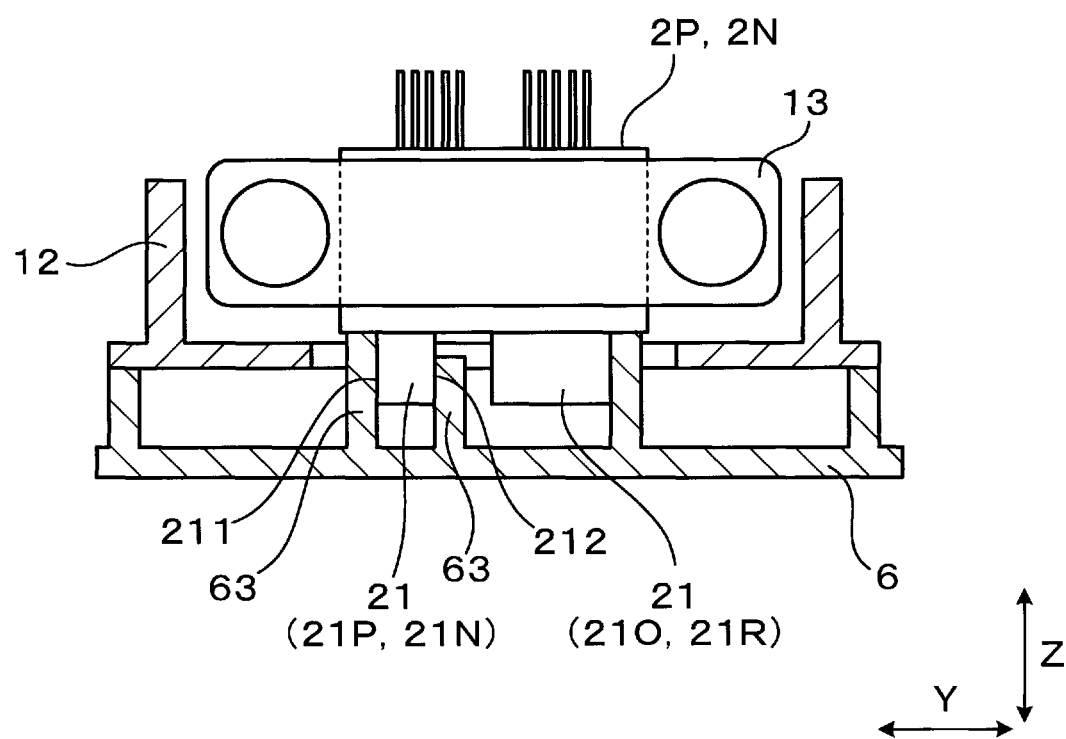
FIG. 21 is a descriptive diagram of a method for positioning semiconductor modules according to Fifth embodiment.

Thus, as illustrated in FIG. 21, positioning can be achieved such that the pair of edges 211 and 212 of one power terminal 21 of each semiconductor module are sandwiched between the pair of positioning portions 63.

Additionally, the power terminals 21 corresponding to the output terminals 21O or intermediate potential terminals 21R of the first semiconductor modules 2P and the second semiconductor modules 2N each have an increased width in the lateral direction Y.

Figure 22:
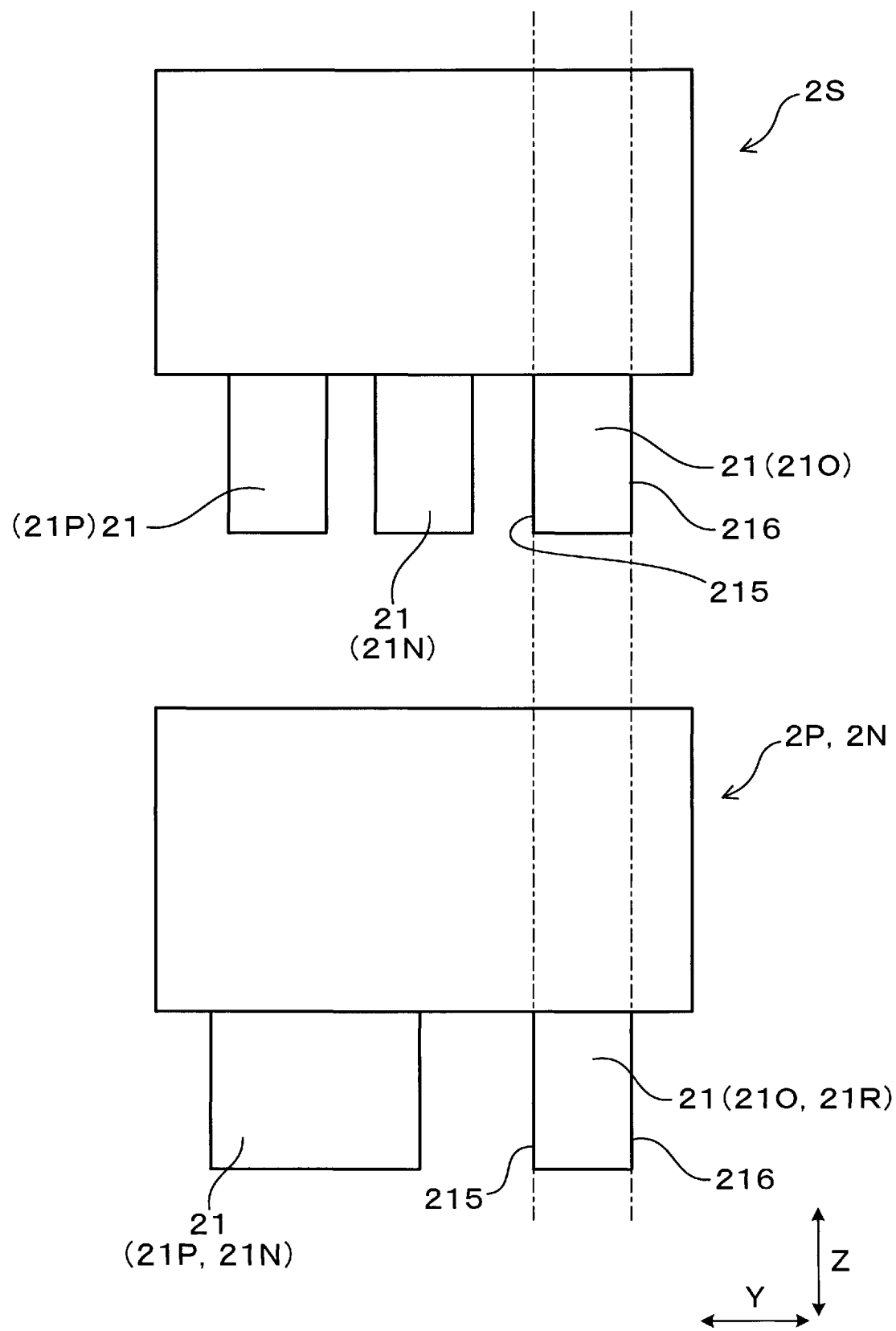
FIG. 22 is a front view illustrating other semiconductor modules according to Fifth embodiment.

As illustrated in FIG. 22, in another possible configuration, the power terminals 21 corresponding to the output terminals 21O or intermediate potential terminals 21R of the first semiconductor modules 2P and the second semiconductor modules 2N are all formed at the same position and have the same width. In this case, the pair of edges 215 and 216 of the output terminal 21O or the intermediate potential terminal 21R may be used for positioning.

Additionally, the positive electrode terminals 21P of the first semiconductor modules 2P and the negative electrode terminals 21N of the second semiconductor modules 2N have an increased width in the lateral direction Y. The configuration illustrated in FIG. 22 is obtained by inverting the configuration illustrated in FIG. 20.

The fifth embodiment otherwise has a configuration, functions, and effects similar to those of Second embodiment.

Sixth Embodiment

Figure 23:
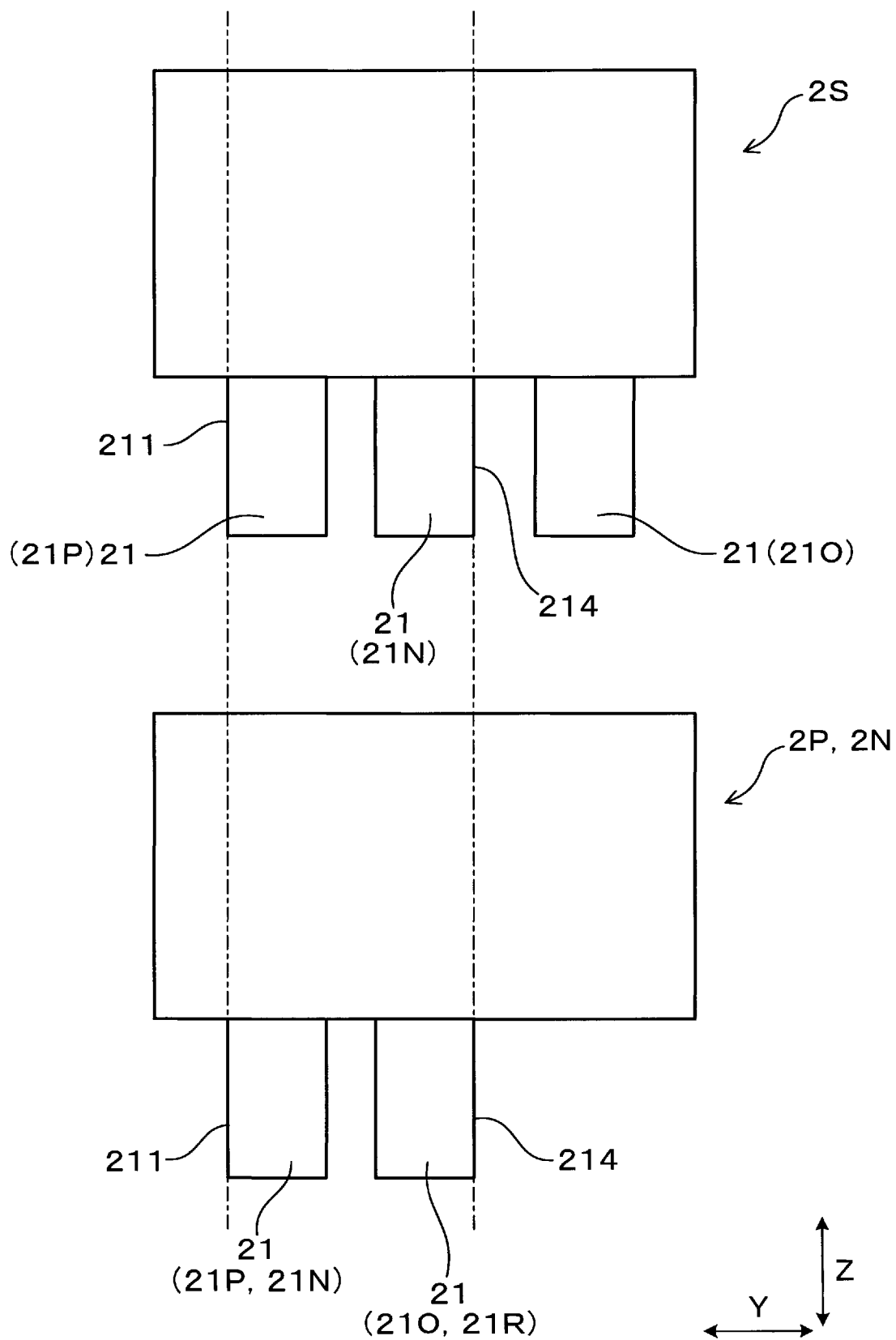
FIG. 23 is a front view illustrating semiconductor modules according to Sixth embodiment.

As illustrated in FIG. 23, in the present embodiment, as illustrated in FIG. 23, the edges 211 and 214 of two adjacent power terminals 21 of each third semiconductor module 2S which edges face opposite directions are used for positioning.

Correspondingly, of the two power terminals 21 of each of the first and third semiconductor modules 2P and 2S, the edges 211 and 214 which face opposite directions are used for positioning.

For example, as illustrated in FIG. 23, the edges 211 and 214 of the positive electrode terminal 21P and negative electrode terminal 21N of each third semiconductor module 2S which edges face opposite directions are used for positioning. Additionally, for the first semiconductor modules 2P, the edges 211 and 214 of the positive electrode terminal 21P and the output terminal 21O which edges face opposite outward directions in the lateral direction Y are used for positioning. Furthermore, for the second semiconductor modules 2N, the edges 211 and 214 of the negative electrode terminal 21N and the output terminal 21O which edges face opposite outward directions in the lateral direction Y are used for positioning.

Figure 24:
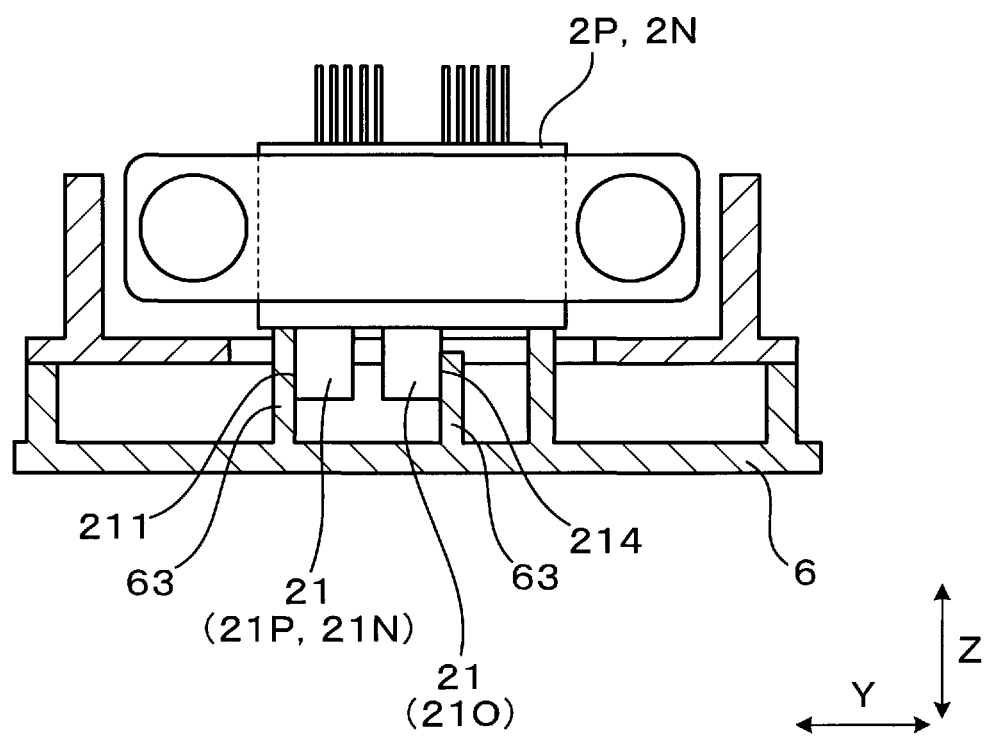
FIG. 24 is a descriptive diagram of a method for positioning semiconductor modules according to Sixth embodiment.

Thus, as illustrated in FIG. 24, the two power terminals 21 can be positioned by being sandwiched between the pair of positioning portions 63 of the positioning jig 6 from the lateral direction Y.

Figure 25:
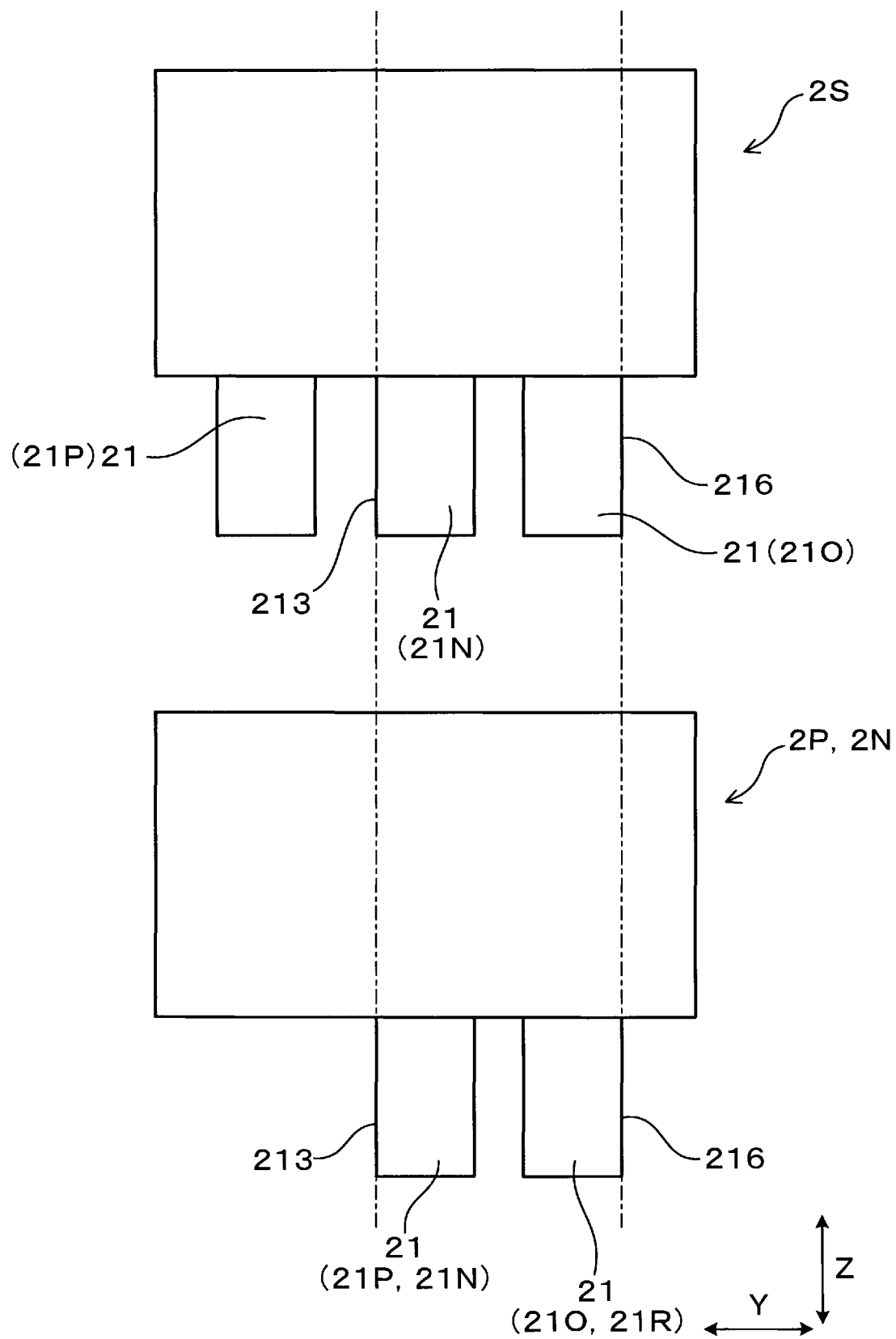
FIG. 25 is a front view illustrating other semiconductor modules according to Sixth embodiment.

Alternatively, as illustrated in FIG. 25, one edge 213 of the negative electrode terminal 21N and one edge 216 of the output terminal 21O in each third semiconductor module 2S can be used for positioning. That is, two power terminals 21 of each of the first and second semiconductor modules 2P and 2N can respectively be formed at the same positions, in the lateral direction Y, as those of the negative electrode terminal 21N and output terminal 21O of each third semiconductor module 2S.

The edges 213 and 216 of two power terminals 21 of each of the first and second semiconductor modules 2P and 2N which edges face opposite outward directions in the lateral direction Y are placed at the same positions as those of the edge 213 of the negative electrode terminal 21N and the edge 216 of the output terminal 21O in each third semiconductor module 2S. In this case, the positioning jig 6 is laterally symmetric compared to the configuration illustrated in FIG. 24.

The sixth embodiment otherwise has a configuration, functions, and effects similar to those of Second embodiment.

Seventh Embodiment

Figure 26:
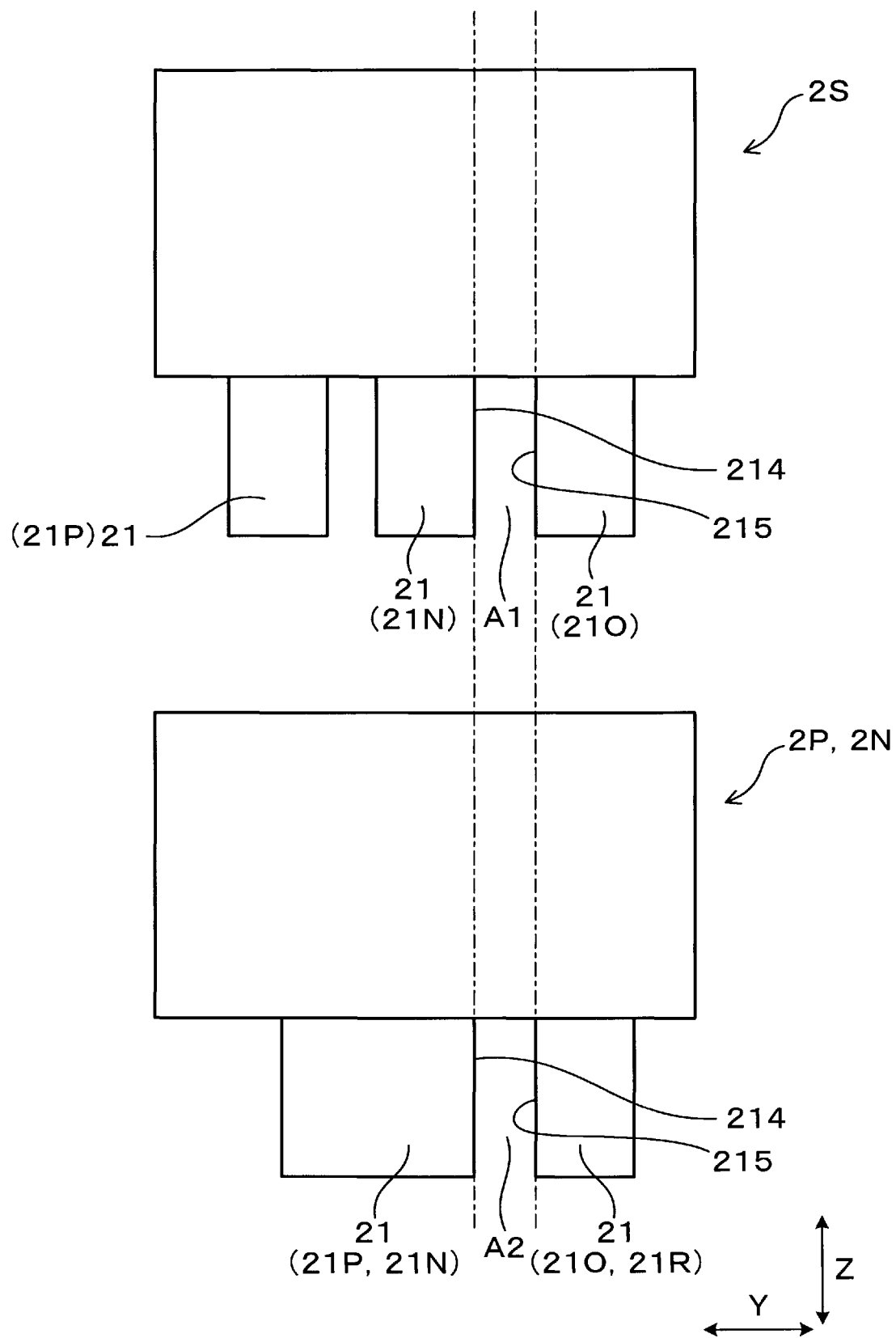
FIG. 26 is a front view illustrating semiconductor modules according to Seventh embodiment.

In the present embodiment, as illustrated in FIG. 26, edges of two adjacent power terminals 21 which edges oppose each other in the lateral direction Y are used for positioning.

That is, an edge 214 of the negative electrode terminal 21N and an edge 215 of the output terminal 21O in each third semiconductor module 2S are used for positioning. Additionally, the opposing edges 214 and 215 of two power terminals 21 of each of the first and second semiconductor modules 2P and 2N are used for positioning.

That is, in the first semiconductor module 2P, the edge 214 of the positive electrode terminal 21P and the edge 215 of the output terminal 21O opposing the edge 214 in the lateral direction Y are used for positioning. Additionally, in the second semiconductor module 2N, the edge 214 of the negative electrode terminal 21N and the edge 215 of the output terminal 21O opposing the edge 214 in the lateral direction Y are used for positioning. In addition, in the third semiconductor module 2S, the edge 214 of the negative electrode terminal 21N and the edge 215 of the output terminal 21O opposing the edge 214 in the lateral direction Y are used for positioning.

The width and position, in the lateral direction Y, of a gap A2 between the two power terminals 21 of each of the first and second semiconductor modules 2P and 2N are equal to the width and position, in the lateral direction Y, of a gap A1 between the negative electrode terminal 21N and output terminal 21O of each third semiconductor module 2S.

Figure 27:
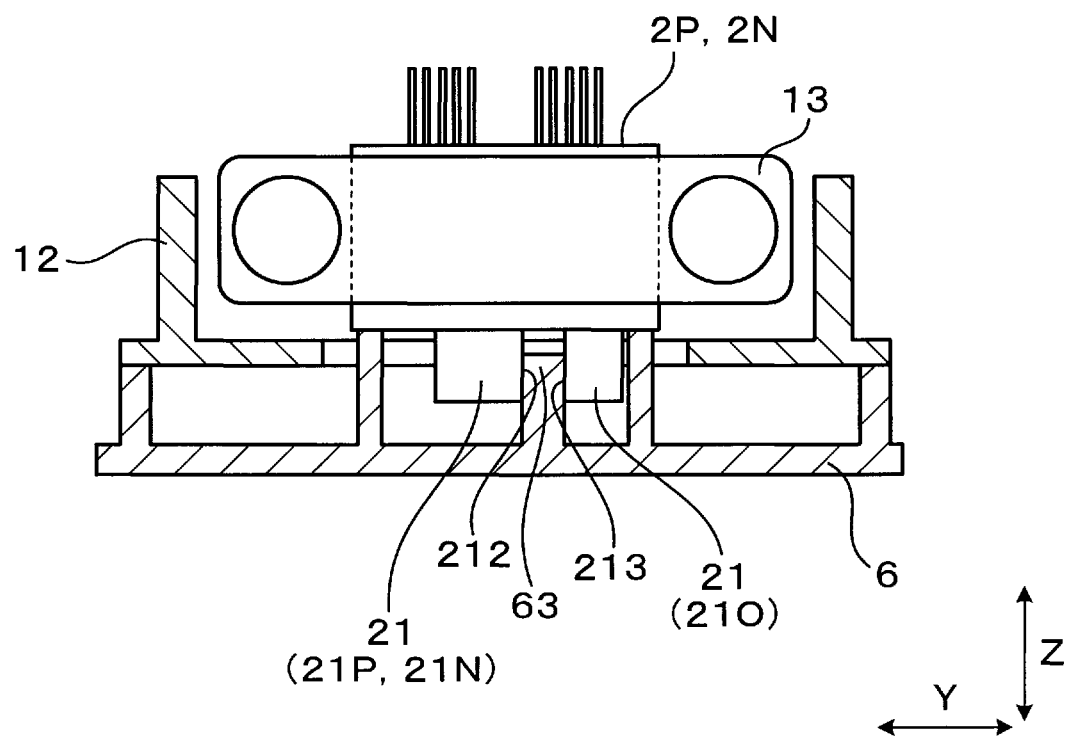
FIG. 27 is a descriptive diagram of a method for positioning semiconductor modules according to Seventh embodiment.

In the present embodiment, as illustrated in FIG. 27, the positioning portions 63 of the positioning jig 6 are fitted into the gaps A1 and A2 between the above-described two power terminals 21 to arrange the plurality of semiconductor modules for positioning in the lateral direction Y.

Note that in, the embodiment illustrated in FIG. 26, the positive electrode terminal 21P or negative electrode terminal 21N of each of the first and second semiconductor modules 2P and 2N has an increased width.

Figure 28:
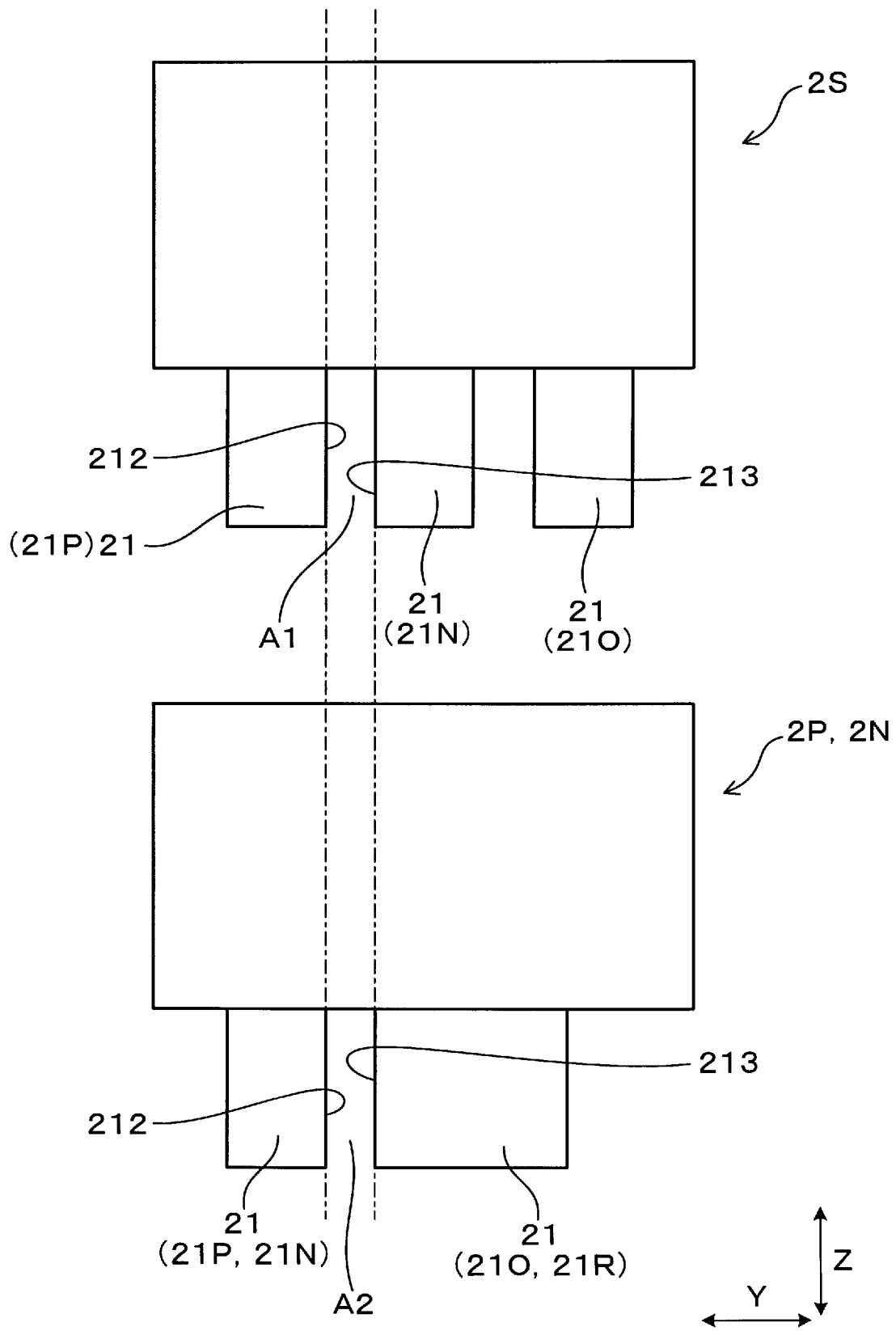
FIG. 28 is a front view illustrating other semiconductor modules according to Seventh embodiment.

Alternatively, as illustrated in FIG. 28, the edges 212 and 213 of the power terminal 21 facing the gap A1 between the positive electrode terminal 21P and negative electrode terminal 21N of each third semiconductor module can be used for positioning. In this case, the positive electrode terminals 21P of the first semiconductor modules 2P and the negative electrode terminals 21N of the second semiconductor modules 2N are disposed at the same positions, in the lateral direction Y, as that of the positive electrode terminals 21P of the third semiconductor modules 2S. The gap A2 between the output terminal 21O or the intermediate potential terminals 21R and the positive electrode terminal 21P of each first semiconductor module 2P or the negative electrode terminal 21N of each second semiconductor module 2N is formed at the same position, in the lateral direction Y, as that of the gap A1 between the positive electrode terminal 21P and negative electrode terminal 21N of each third semiconductor module 2S and have the same width as that of the gap A1 in the lateral direction Y.

In this case, the positioning jig 6 is laterally symmetric compared to the configuration illustrated in FIG. 27.

Seventh embodiment otherwise has a configuration, functions, and effects similar to those of Second embodiment.

Eighth Embodiment

Figure 29:
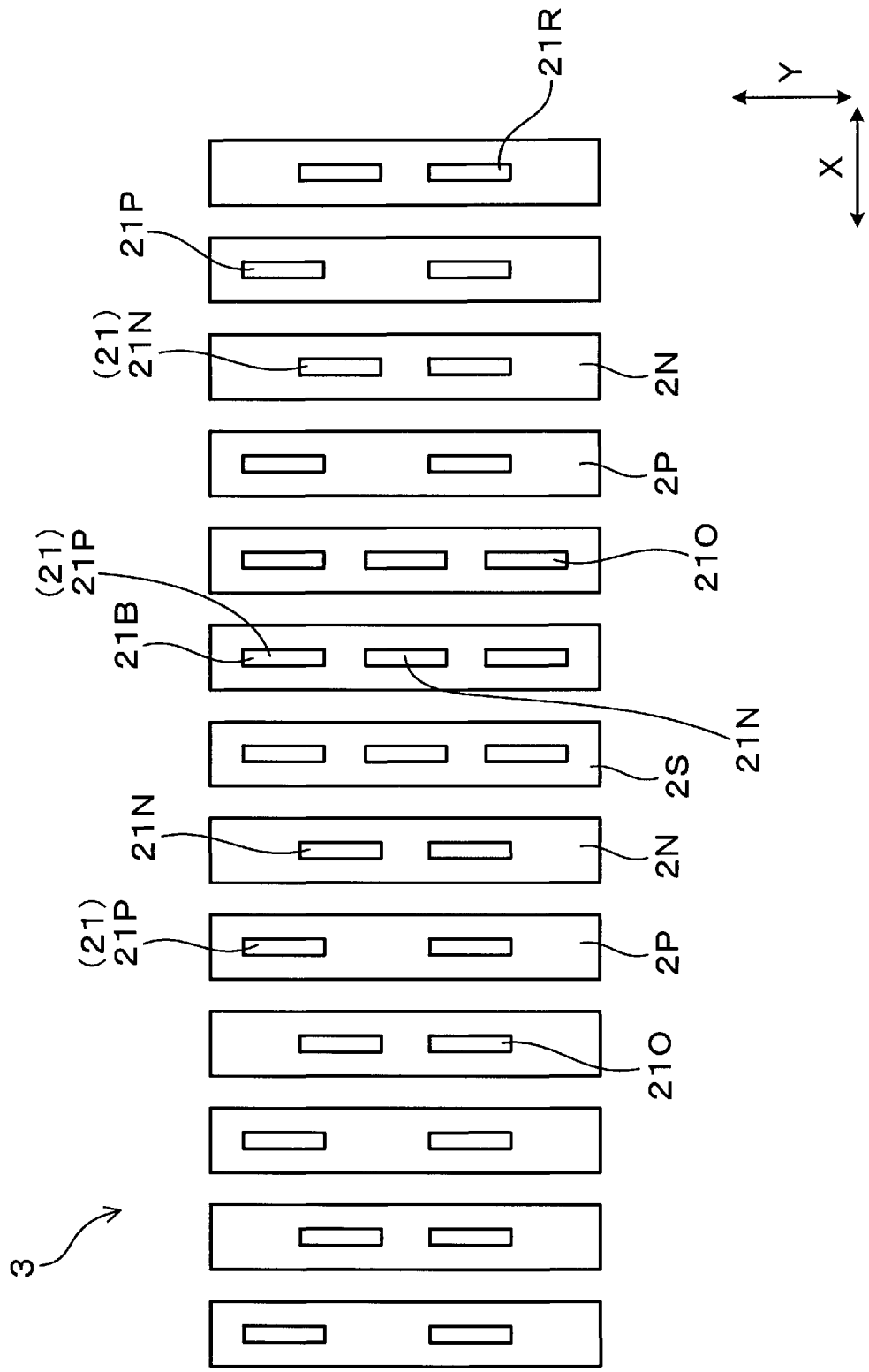
FIG. 29 is a plan view of a layered portion according to Eighth embodiment.
Figure 30:
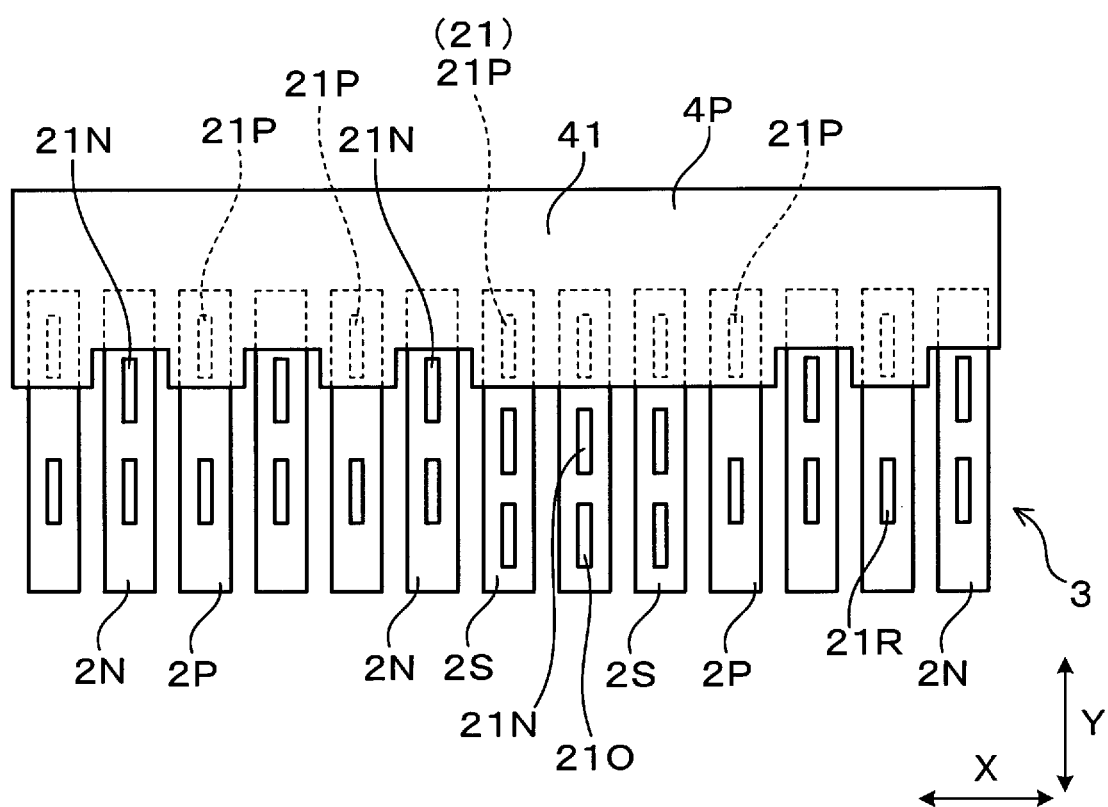
FIG. 30 is a plan view of the layered portion and a positive electrode bus bar according to Eighth embodiment.

In the present embodiment, as illustrated in FIG. 29 and FIG. 30, only the negative electrode terminal 21N in each semiconductor module 2N is provided farther from the bus bar body portion 41 than the positive electrode terminal 21P of the third semiconductor module 2S, used as the reference terminal 21B.

Note that, in FIG. 29, illustration of the bus bar body portion 41 is omitted but that, as illustrated in FIG. 30, the bus bar body portion 41 is disposed in the layered portion 3 on a side opposed to a side where the output terminals 21O are disposed.

In the present embodiment, the positive electrode terminal 21P of each first semiconductor module 2P is provided at the same position, in the lateral direction Y, as that of the positive electrode terminal 21P of the third semiconductor module 2S in the lateral direction Y.

In the present embodiment, the positive electrode bus bar 4P can be disposed as illustrated in FIG. 30. In other words, since the positive electrode terminal 21P of each first semiconductor module 2P is provided at the same position as that of the positive electrode terminal 21P of the third semiconductor module 2S, the recessed and protruding shape of a side of the positive electrode bus bar 4P corresponding to the center of the layered portion 3 can be reduced. This enables a further reduction in the distance of the current path between the positive electrode terminals 21P via the positive electrode bus bar 4P.

The eighth embodiment otherwise has a configuration, functions, and effects similar to those of first embodiment.

Ninth Embodiment

Figure 31:
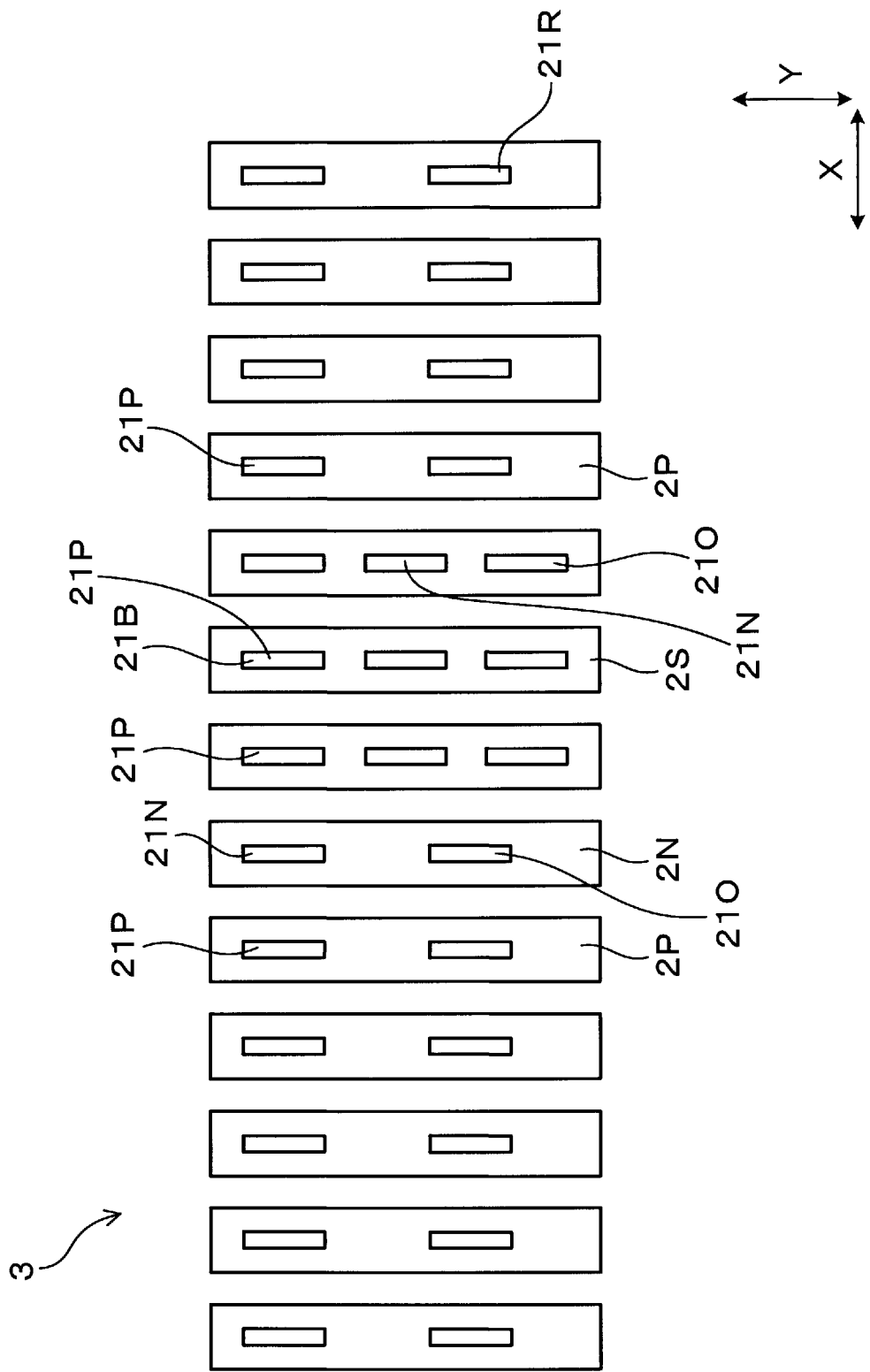
FIG. 31 is a plan view of a layered portion according to Ninth embodiment.

In the present embodiment, as illustrated in FIG. 31, the positive electrode terminal 21P of each first semiconductor module 2P and the negative electrode terminal 21N of each second semiconductor module 2N are provided at the same position, in the lateral direction Y, as that of the positive electrode terminal 21P of each third semiconductor module 2S, used as the reference terminal 21B.

On the other hand, the output terminal 21O and intermediate potential terminal 21R of each of the first and second semiconductor modules 2P and 2N are located closer to the bus bar body portion 41 than the output terminal 21O of each third semiconductor module 2S. Accordingly, the output bus bars 4O connected to the first semiconductor modules 2P and the second semiconductor modules 2N can be inhibited from spreading excessively in opposite outward directions in the lateral direction Y with respect to the layered portion 3. This configuration is similar to the configuration in First embodiment.

The ninth embodiment otherwise has a configuration, functions, and effects similar to those of the first embodiment.

Tenth Embodiment

Figure 32:
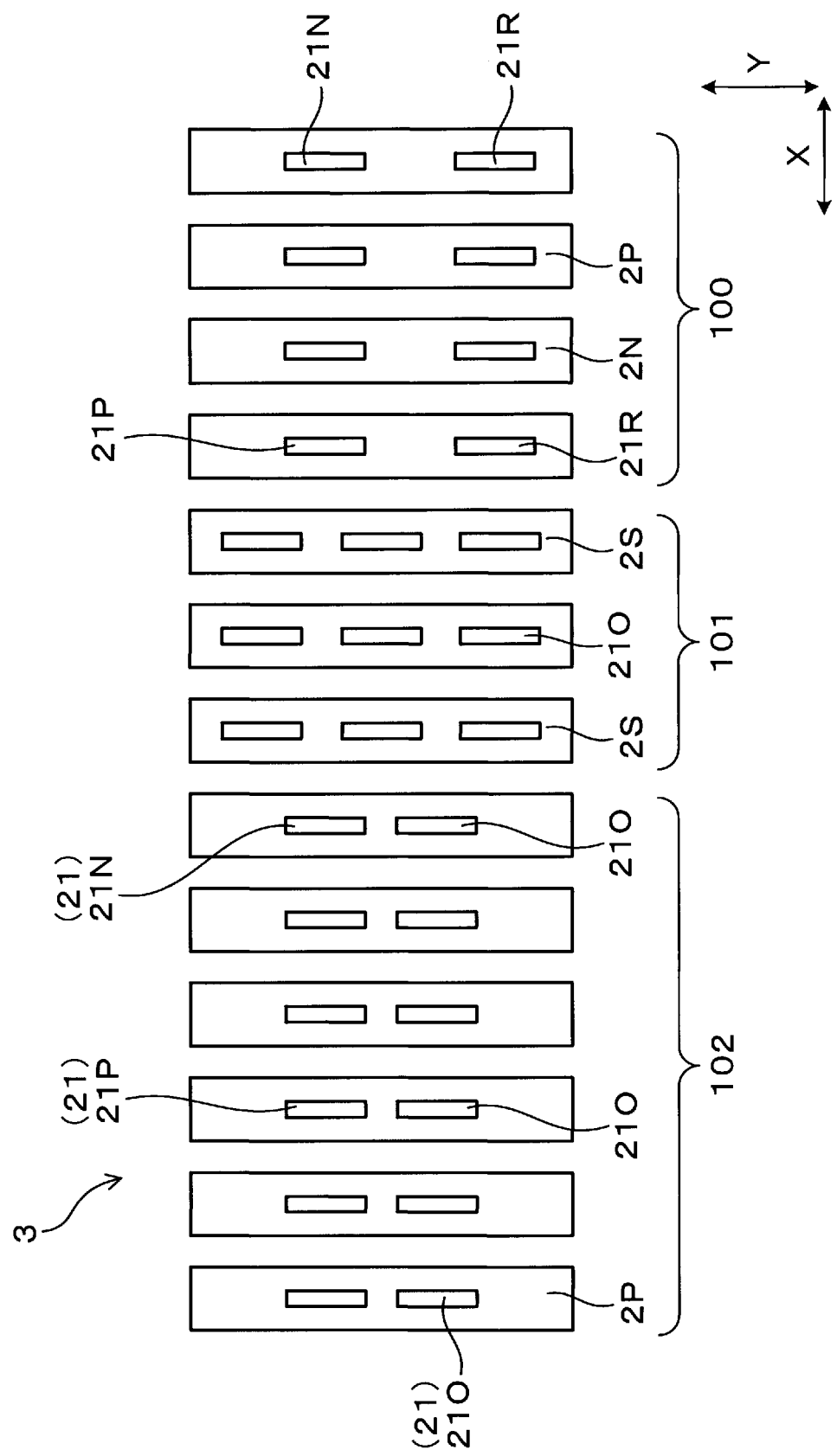
FIG. 32 is a plan view of a layered portion according to First embodiment.

In the present embodiment, as illustrated in FIG. 32, each of the intermediate potential terminals 21R in the booster circuit unit 100 is provided at a position, in the lateral direction Y, different from that of each of the output terminals 21O in the second inverter circuit unit 102.

In the present embodiment, the output terminal 21O of each of the first and second semiconductor modules 2P and 2N is located closer, in the lateral direction Y, to the bus bar body portion 41 than the output terminal 21O of each third semiconductor module 2S. On the other hand, each of the intermediate potential terminals 21R in the booster circuit unit 100 is disposed at a position substantially equivalent to that of the output terminal 21O of each third semiconductor module 2S.

The tenth embodiment otherwise has a configuration, functions, and effects similar to those of the first embodiment.

Comparative Embodiment

Figure 33:
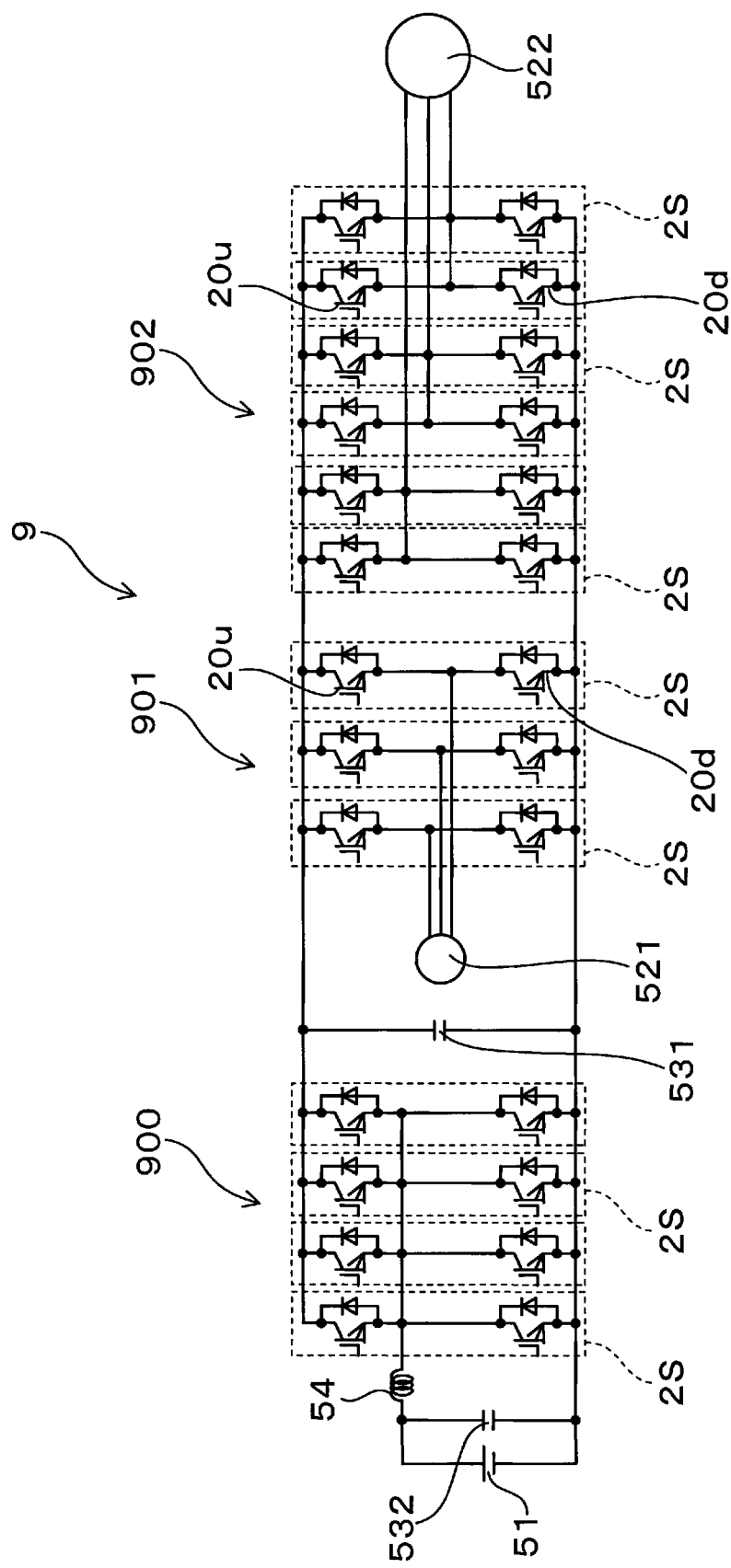
FIG. 33 is a plan view of a layered portion according to a comparative embodiment.

In the present comparative embodiment, as illustrated in FIG. 33, a power conversion device 9 includes a switching circuit unit all of which is configured using third semiconductor modules 2S.

In other words, not only a first inverter circuit unit 901 but also a second inverter circuit unit 902 and a booster circuit unit 900 are configured using a plurality of third semiconductor modules 2S. Furthermore, in the second inverter circuit unit 902 and the booster circuit unit 100, the third semiconductor modules 2S are connected together in parallel to form one leg.

Figure 34:
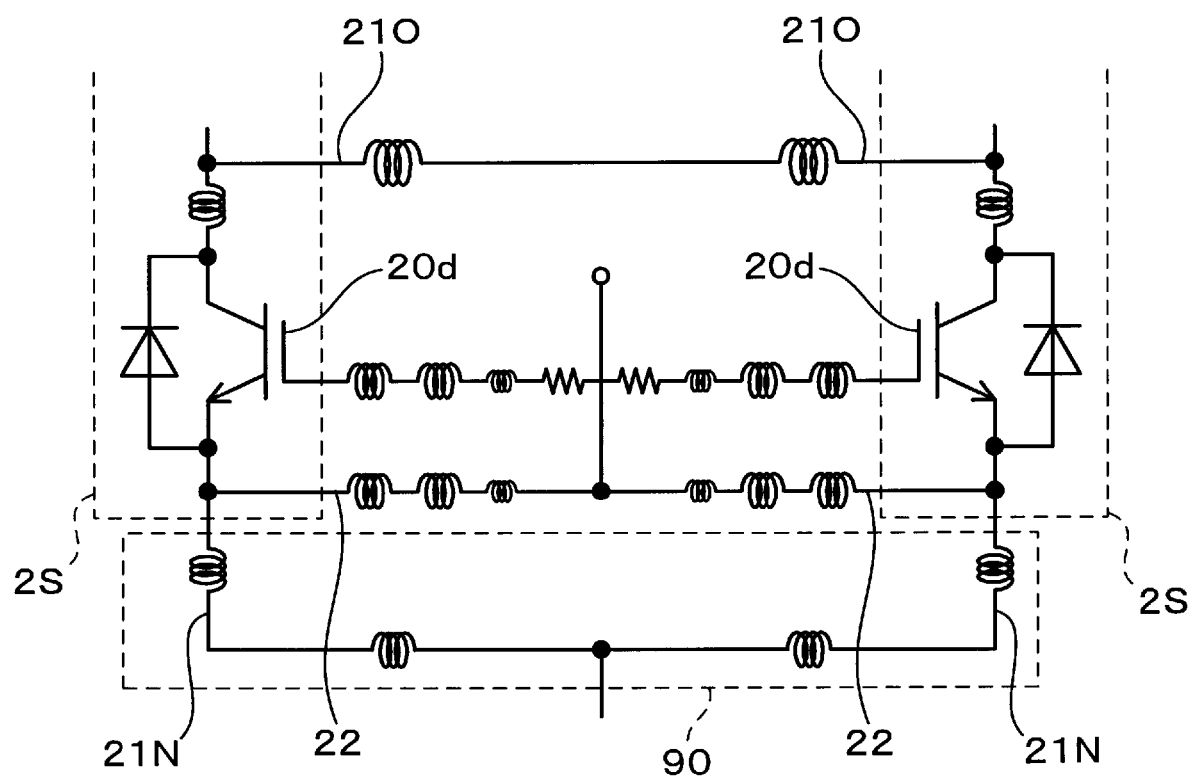
FIG. 34 is an equivalent circuit diagram of a part of a switching circuit portion according to the comparative embodiment.

In this case, inductance tends to occur in the connection wiring between the plurality of third semiconductor modules. FIG. 34 illustrates an equivalent circuit diagram illustrating wiring inductance in lower arm portions of two parallel-connected third semiconductor modules 2S. As illustrated in FIG. 34, emitters of lower-arm switching elements 20d in the two third semiconductor modules 2S are connected together at the negative electrode terminals 21N of the third semiconductor module 2S. A large inductance is likely to occur in connection wiring 90.

In this case, due to characteristic tolerances of the two parallel-connected switching elements 20d, currents flowing through the switching elements may vary. Then, the variation in currents and the inductance in the connection wiring 90 may excessively increase or reduce a gate-emitter voltage in each switching element 20d. Prevention of excessive increase or reduction in gate-emitter voltage needs to reduce a switching speed. A reduced switching speed increases a loss in each switching element 20d. This results in increased size and cost of the switching element 20d. Note that the above-described phenomenon also occurs in an upper arm.

As a result, a reduction in a loss in the power conversion device 9 and in the size and cost thereof is difficult.

In contrast, in the power conversion device 1 illustrated in First embodiment and the like, the above-described problem is solved by appropriately utilizing the first semiconductor modules 2P and the second semiconductor modules 2N. In other words, by using the semiconductor modules 2P and 2N with the parallel-connected switching elements integrated together, the wiring inductance among the parallel-connected switching elements can be significantly reduced. Accordingly, a reduction in the loss in the power conversion device 1 and in the size and cost thereof is facilitated.

The present disclosure is not limited each of the embodiments and can be applied to various embodiments without departing from the spirits of the disclosure.

The present disclosure has been described in compliance with the embodiments. However, it should be appreciated that the present disclosure is not limited to the embodiments or the structures. The present disclosure also includes various modified examples and modifications within the range of equivalency. In addition, the category of the present disclosure and the range of ideas thereof cover various combinations and forms and other combinations and forms including only one element, two or more elements, or a fraction of the element.

In each of the above-described embodiments, the booster circuit unit 100 is provided. However, the booster circuit unit 100 may be omitted from the power conversion device. Additionally, in a case where the booster circuit unit 100 is provided, the booster circuit unit 100 may be configured using the third semiconductor modules 2S. In this case, the booster circuit unit 100 may be configured using one third semiconductor module 2S or a plurality of parallel-connected third semiconductor modules.

Additionally, the first semiconductor module 2P and the second semiconductor module 2N each include different types of semiconductor elements connected together in parallel. For example, an SiC-MOSFET and an Si-IGBT may be connected in parallel with one semiconductor module. The SiC-MOSFET is a MOSFET formed of SiC (that is, silicon carbide). Additionally, the Si-IGBT is an IGBT formed of Si (that is, silicon). Furthermore, an Si-RCIGBT can be used as a switching element. The RCIGBT is a semiconductor element including an IGBT with which a freewheel diode is integrated.

Additionally, the first semiconductor module 2P and the second semiconductor module 2N are each not limited to two parallel-connected switching elements and may include three or more parallel-connected switching elements.

Additionally, for example, arrangement of the power terminals in the third semiconductor module is not particularly limited. For example, the positive electrode terminal may be disposed in the center in the lateral direction.

CONCLUSION

As described above, a power conversion device according to the present disclosure is described so far.

An object of the present disclosure is to provide a power conversion device capable of facilitating a reduction in loss, size, and cost.

An aspect of the present disclosure is a power conversion device provided with a switching circuit unit including a plurality of upper-arm switching elements connected to positive electrode wiring and a plurality of lower-arm switching elements connected to negative electrode wiring, the power conversion device including:

a first semiconductor module incorporating a plurality of the upper-arm switching elements connected together in parallel, a second semiconductor module incorporating a plurality of the lower-arm switching elements connected together in parallel, and a third semiconductor module incorporating the upper-arm switching elements connected together in series and the lower-arm switching elements connected together in series.

The above-described power conversion device includes the first semiconductor module, the second semiconductor module, and the third semiconductor module. This facilitates a reduction in a loss in the power conversion device and in the size and cost thereof.

First, the first semiconductor module, the second semiconductor module, and the third semiconductor module each incorporate a plurality of intensively arranged switching elements. This facilitates a reduction in the size and cost of the power conversion device.

Additionally, in the power conversion device, the first semiconductor module or the second semiconductor module is used for the arm through which a relatively large amount of current flows, to be adapted for a large current capability. Furthermore, the first semiconductor module and the second semiconductor module each incorporate a plurality of the switching elements connected together in parallel. This enables a reduction in the length of the connection wiring between the switching elements connected together in parallel in each semiconductor module. As a result, inductance in the connection wiring can be reduced. Accordingly, switching losses can be reduced.

Additionally, the third semiconductor module is used for the arm through which a relatively small amount of current flows, enabling a reduction in the number of semiconductor modules in the power conversion device. As a result, the size and cost of the power conversion device can be reduced.

In this way, the power conversion device includes the first semiconductor module, the second semiconductor module, and the third semiconductor module, facilitating a reduction in loss, size, and cost.

As described above, according to the above-described aspect, a power conversion device can be provided that is capable of facilitating a reduction in loss, size, and cost.

What is claimed is:

1. A power conversion device provided with a switching circuit unit including a plurality of upper-arm switching elements connected to positive electrode wiring and a plurality of lower-arm switching elements connected to negative electrode wiring, the power conversion device (1) comprising:

a first semiconductor module incorporating a plurality of the upper-arm switching elements connected together in parallel, a second semiconductor module incorporating a plurality of the lower-arm switching elements connected together in parallel, a third semiconductor module incorporating the upper-arm switching elements connected together in series and the lower-arm switching elements connected together in series, a positive electrode bus bar included in the positive electrode wiring, and a negative electrode bus bar included in the negative electrode wiring, wherein a plurality of semiconductor modules including the first semiconductor module, the second semiconductor module, and the third semiconductor module are layered to form a layered portion, each of the plurality of semiconductor modules comprises a plurality of power terminals protruding in one of opposite directions along a vertical direction orthogonal to a layering direction of the layered portion, the positive electrode bus bar and the negative electrode bus bar comprise bus bar body portions disposed on one side in a lateral direction orthogonal to both the layering direction and the vertical direction with respect to a connection portion with the power terminals as viewed from the vertical direction, the bus bar body portions being opposed to each other, an output terminal included in the plurality of power terminals 21 and connected to output wiring is disposed farthest from the bus bar body portions in the lateral direction, a positive electrode terminal connected to the positive electrode bus bar and a negative electrode terminal connected to the negative electrode bus bar, the positive electrode terminal and the negative electrode terminal being included in the plurality of power terminals, are disposed closest to the bus bar body portions in the lateral direction, the power terminal in the third semiconductor module disposed closest to the bus bar body portions is used as a reference terminal, and the power terminal corresponding to one of the positive electrode bus bar of the first semiconductor module and the negative electrode bus bar of the second semiconductor module and having a potential different from a potential of the reference terminal is disposed at a same position as a position of the reference terminal or positioned farther from the bus bar body portions than the reference terminal, in the lateral direction.

2. The power conversion device according to claim 1, comprising:

a positive electrode bus bar included in the positive electrode wiring and a negative electrode bus bar included in the negative electrode wiring, wherein a plurality of semiconductor modules including the first semiconductor module, the second semiconductor module, and the third semiconductor module are layered to form a layered portion, each of the plurality of semiconductor modules comprises a plurality of power terminals protruding in one of opposite directions along the vertical direction orthogonal to the layering direction of the layered portion, a bus bar body portions comprising the positive electrode bus bar and the negative electrode bus bar opposed to each other is disposed on one side in the lateral direction orthogonal to both the layering direction and the vertical direction with respect the layered portion as viewed from the vertical direction, an output terminal included in the plurality of power terminals 21 and connected to output wiring is disposed farthest from the bus bar body portions in the lateral direction, a positive electrode terminal connected to the positive electrode bus bar and a negative electrode terminal connected to the negative electrode bus bar, the positive electrode terminal and the negative electrode terminal being included in the plurality of power terminals, are disposed closest to the bus bar body portions in the lateral direction, and the output terminal in the first semiconductor module and the output terminal in the second semiconductor module are disposed at a same position as a position of the output terminal in the third semiconductor module or positioned closer to the bus bar body portions than the reference terminal, in the lateral direction.

3. A power conversion device provided with a switching circuit unit including a plurality of upper-arm switching elements connected to positive electrode wiring and a plurality of lower-arm switching elements connected to negative electrode wiring, the power conversion device comprising:

a first semiconductor module incorporating a plurality of the upper-arm switching elements connected together in parallel, a second semiconductor module incorporating a plurality of the lower-arm switching elements connected together in parallel, a third semiconductor module incorporating the upper-arm switching elements connected together in series and the lower-arm switching elements connected together in series, a positive electrode bus bar included in the positive electrode wiring, and a negative electrode bus bar included in the negative electrode wiring, wherein a plurality of semiconductor modules including the first semiconductor module, the second semiconductor module, and the third semiconductor module are layered to form a layered portion, each of the plurality of semiconductor modules comprises a plurality of power terminals protruding in one of opposite directions along the vertical direction orthogonal to the layering direction of the layered portion, a bus bar body portions comprising the positive electrode bus bar and the negative electrode bus bar opposed to each other is disposed on one side in the lateral direction orthogonal to both the layering direction and the vertical direction with respect the layered portion as viewed from the vertical direction, an output terminal included in the plurality of power terminals 21 and connected to output wiring is disposed farthest from the bus bar body portions in the lateral direction, a positive electrode terminal connected to the positive electrode bus bar and a negative electrode terminal connected to the negative electrode bus bar, the positive electrode terminal and the negative electrode terminal being included in the plurality of power terminals, are disposed closest to the bus bar body portions in the lateral direction, and the output terminal in the first semiconductor module and the output terminal in the second semiconductor module are disposed at a same position as a position of the output terminal in the third semiconductor module or positioned closer to the bus bar body portions than the reference terminal, in the lateral direction.

4. The power conversion device according to claim 1, wherein the first semiconductor module and the second semiconductor module are layered and each comprise a module body portion and two power terminals protruding from the module body portion in one of opposite directions along the vertical direction orthogonal to the layering direction, and as viewed from the layering direction, the two power terminals are disposed on opposite sides across a center line passing through a center in the lateral direction orthogonal to both the layering direction and the vertical direction.

5. A power conversion device provided with a switching circuit unit including a plurality of upper-arm switching elements connected to positive electrode wiring and a plurality of lower-arm switching elements connected to negative electrode wiring, the power conversion device comprising:

a first semiconductor module incorporating a plurality of the upper-arm switching elements connected together in parallel, a second semiconductor module incorporating a plurality of the lower-arm switching elements connected together in parallel, and a third semiconductor module incorporating the upper-arm switching elements connected together in series and the lower-arm switching elements connected together in series, wherein the first semiconductor module and the second semiconductor module are layered and each comprise a module body portion and two power terminals protruding from the module body portion in one of opposite directions along the vertical direction orthogonal to the layering direction, and as viewed from the layering direction, the two power terminals are disposed on opposite sides across a center line passing through a center in the lateral direction orthogonal to both the layering direction and the vertical direction.

6. The power conversion device according to claim 5, wherein the first semiconductor module and the second semiconductor module have a same structure and are layered inverted with respect to each other around the center line.

7. The power conversion device according to claim 4, wherein the positive electrode terminal corresponding to the power terminal of the first semiconductor module connected to the positive electrode wiring and the negative electrode terminal corresponding to the power terminal of the second semiconductor module connected to the negative electrode wiring are opposed to each other in the layering direction.

8. The power conversion device according to claim 4, wherein
the output terminals corresponding to the power terminals of the first semiconductor module and the second semiconductor module connected to output wiring are opposed to each other in the layering direction.

9. The power conversion device according to claim 1, wherein
a plurality of semiconductor modules including the first semiconductor module, the second semiconductor module, and the third semiconductor module are layered to form a layered portion,
each of the plurality of semiconductor modules comprises a plurality of power terminals protruding in one of opposite directions along the vertical direction orthogonal to the layering direction of the layered portion, and
the plurality of semiconductor modules are disposed such that, of edges of the plurality of power terminals in the lateral direction orthogonal to both the layering direction and the vertical direction, at least two edges facing opposite directions overlap in the layering direction.

10. A power conversion device provided with a switching circuit unit including a plurality of upper-arm switching elements connected to positive electrode wiring and a plurality of lower-arm switching elements connected to negative electrode wiring, the power conversion device comprising:
a first semiconductor module incorporating a plurality of the upper-arm switching elements connected together in parallel,
a second semiconductor module incorporating a plurality of the lower-arm switching elements connected together in parallel, and
a third semiconductor module incorporating the upper-arm switching elements connected together in series and the lower-arm switching elements connected together in series,
wherein
a plurality of semiconductor modules including the first semiconductor module, the second semiconductor module, and the third semiconductor module are layered to form a layered portion,
each of the plurality of semiconductor modules comprises a plurality of power terminals protruding in one of opposite directions along the vertical direction orthogonal to the layering direction of the layered portion, and
the plurality of semiconductor modules are disposed such that, of edges of the plurality of power terminals in the lateral direction orthogonal to both the layering direction and the vertical direction, at least two edges facing opposite directions overlap in the layering direction.

11. The power conversion device according to claim 1, comprising a circuit board including a driving circuit driving the switching circuit unit, wherein
the first semiconductor module, the second semiconductor module, and the third semiconductor module each comprise the power terminal protruding opposite to the circuit board.

12. A power conversion device provided with a switching circuit unit including a plurality of upper-arm switching elements connected to positive electrode wiring and a plurality of lower-arm switching elements connected to negative electrode wiring, the power conversion device comprising:
a first semiconductor module incorporating a plurality of the upper-arm switching elements connected together in parallel,
a second semiconductor module incorporating a plurality of the lower-arm switching elements connected together in parallel,
a third semiconductor module incorporating the upper-arm switching elements connected together in series and the lower-arm switching elements connected together in series, and
a circuit board including a driving circuit driving the switching circuit unit,
wherein
the first semiconductor module, the second semiconductor module, and the third semiconductor module each comprise the power terminal protruding opposite to the circuit board.

* * * * *